United States Patent
Kang et al.

(12) 
(10) Patent No.: US 6,319,731 B1
(45) Date of Patent: Nov. 20, 2001

(54) METHOD FOR MANUFACTURING A NON-VOLATILE MEMORY DEVICE

(75) Inventors: Hee Bok Kang, Daejeon-si; Jun Sik Lee, Chungcheongbuk-do, both of (KR)

(73) Assignee: Hyundai Electronics Industries Co., Ltd., Ichon-shi (KR)

(*) Notice: Subject to any disclaimer, the term of this patent is extended or adjusted under 35 U.S.C. 154(b) by 0 days.

(21) Appl. No.: 09/597,260

(22) Filed: Jun. 19, 2000

(30) Foreign Application Priority Data

Jul. 5, 1999 (KR) .................................................. 99-26871

(51) Int. Cl.⁷ .............................. H01L 21/00; H01L 21/20
(52) U.S. Cl. .............................. 438/3; 438/396; 438/694; 438/710
(58) Field of Search .............................. 438/3, 694, 396, 438/618, 253, 643, 240, 710, 268, 669, 712, 722

(56) References Cited

U.S. PATENT DOCUMENTS

| | | | |
|---|---|---|---|
| 4,873,664 | 10/1989 | Eaton, Jr. ............................. | 365/145 |
| 6,118,687 * | 9/2000 | Kang ................................... | 365/145 |
| 6,240,007 * | 5/2001 | Kang ................................... | 365/145 |

* cited by examiner

*Primary Examiner*—Matthew Smith
*Assistant Examiner*—Igwe U. Anya
(74) *Attorney, Agent, or Firm*—Fleshner & Kim, LLP

(57) ABSTRACT

A nonvolatile ferroelectric memory device and a method for manufacturing the same increase capacitance by ensuring an area of a capacitor to the maximum degree and simplify process steps by facilitating layout design. The nonvolatile ferroelectric memory device according to the present invention includes first and second split wordlines formed at a certain interval in one direction, first and second bitlines formed across the first and second split wordlines at a certain interval, first and second source/drain impurity regions respectively formed at both sides of the first and second split wordlines, a first ferroelectric capacitor formed on the second split wordline, having a lower electrode electrically connected with the first source impurity region and an upper electrode connected with the second split wordline, and a second ferroelectric capacitor formed on the first split wordline, having a lower electrode electrically connected with the second source impurity region and an upper electrode connected with the first split wordline.

14 Claims, 26 Drawing Sheets

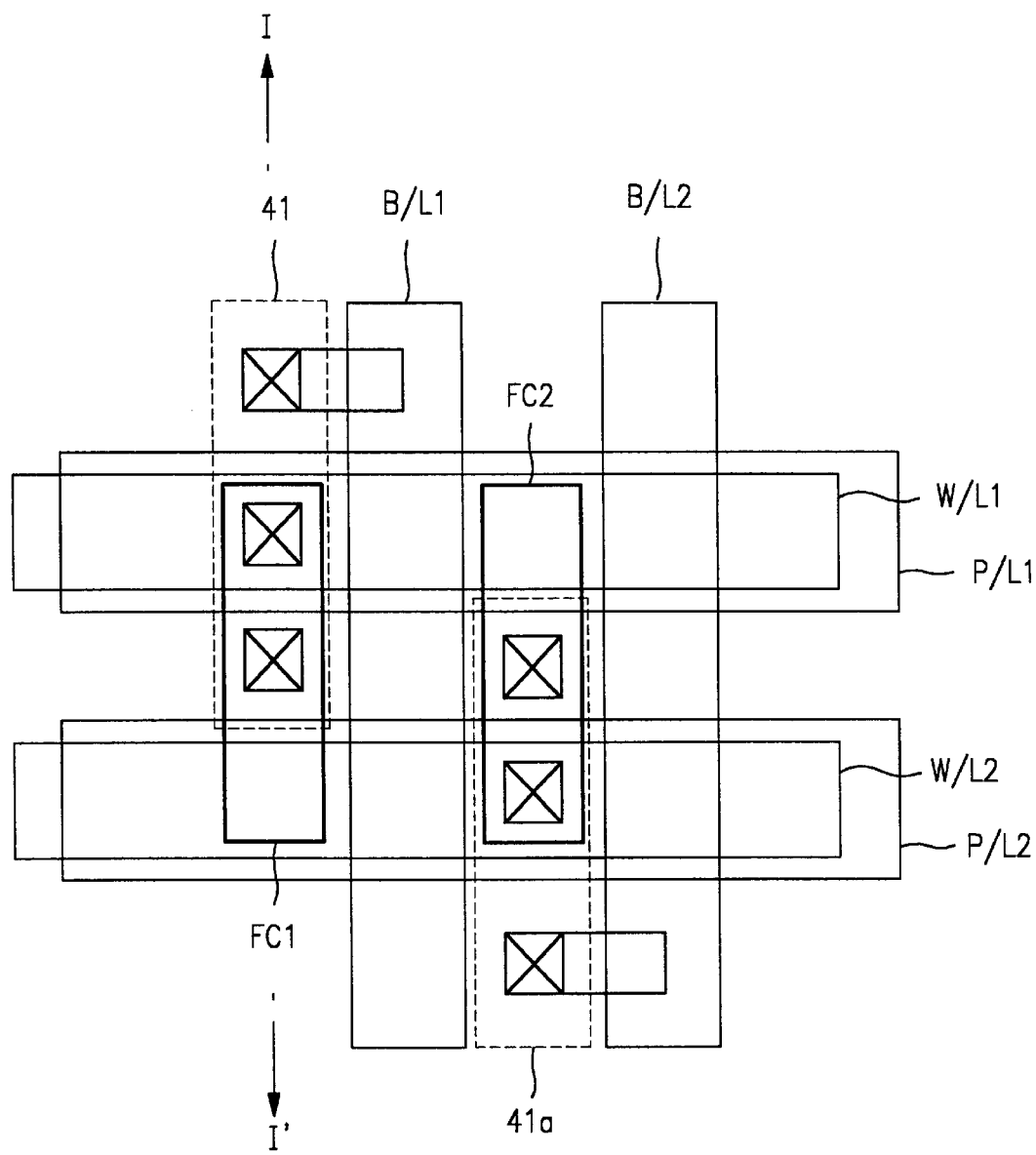

METHOD FOR MANUFACTURING A NON-VOLATILE MEMORY DEVICE

BACKGROUND OF THE INVENTION

1. Field of the Invention

The present invention relates to a nonvolatile memory device, and more particularly, to a nonvolatile ferroelectric memory device and a method for manufacturing the same, which are suitable for efficient layout design and cell size reduction.

2. Background of the Related Art

Generally, a nonvolatile ferroelectric memory, i.e., ferroelectric random access memory (FRAM) has data processing speed as much as dynamic random access memory (DRAM) and retains data even in power off. For this reason, the nonvolatile ferroelectric memory has received much attention as a net generation memory device.

The FRAM and DRAM are memory devices which have almost similar structures, and include a ferroelectric capacitor having high residual polarization characteristic. Such residual polarization characteristic permits data not to be erased even if electric field is removed.

FIG. 1 shows hysteresis loop of a general ferroelectric.

As shown in FIG. 1, even if polarization organized by electric field removes electric field, data is maintained at a certain amount (d and a states) without being erased due to the presence of residual polarization (or spontaneous polarization).

A nonvolatile ferroelectric memory cell is applied as a memory device by corresponding d, a state to 1, 0, respectively.

A driving circuit of a related art nonvolatile ferroelectric memory device will be described with reference to the accompanying drawings.

FIG. 2 shows unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 whose gate is connected with the wordline and source is connected with the bitline, and a ferroelectric capacitor FC1 whose first terminal is connected with a drain of the transistor T1 and second terminal is connected with the plate line P/L.

Data input/output operation of the related art nonvolatile ferroelectric memory device will be described below.

FIG. 3a is a timing chart illustrating the operation of write mode of the related art nonvolatile ferroelectric memory device and FIG. 3b is a timing chart illustrating the operation of read mode thereof.

In case of write mode, an externally applied chip enable signal CSBpad is activated from high state to low state. At the same time, if a write enable signal WEBpad is applied from high state to low state, the write mode starts.

Subsequently, if address decoding in the write mode starts, a pulse applied to a corresponding wordline is transited from low state to high state, so that cell is selected.

A high signal in a certain period and a low signal in a certain period are sequentially applied to a corresponding plate line in a period where the wordline is high.

To write a logic value "1" or "0" in the selected cell, a high signal or low signal synchronized with the write enable signal WEBpad is applied to a corresponding bit line.

In other words, a high signal is applied to the bitline, and if the signal applied to the plate line in a period, where the signal applied to the wordline is high, is low, a logic value "1" is written in the ferroelectric capacitor.

A low signal is applied to the bitline, and if the signal applied to the plate line is high, a logic value "0" is written in the ferroelectric capacitor.

Reading operation of data stored in a cell by the above operation of the write mode will be described below.

If an externally applied chip enable signal CSBpad is activated from high state to low state, all of bitlines become equipotential to low voltage by an equalizer signal before a corresponding wordline is selected.

Then, the respective bitline becomes inert and address is decoded. The low signal is transited to the high signal in the corresponding wordline by the decoded address so that a corresponding cell is selected.

The high signal is applied to the plate line of the selected cell to destruct data corresponding to the logic value "1" stored in the ferroelectric memory.

If the logic value "0" is stored in the ferroelectric memory, the corresponding data is not destructed.

The destructed data and the data which is not destructed are output as different values by the aforementioned hysteresis loop principle, so that a sensing amplifier senses the logic value "1" or "0".

In other words, if the data is destructed, "d" state is transited to "f" state as shown in hysteresis loop of FIG. 1. If the data is not destructed, "a" state is transited to "f" state. Thus, if the sensing amplifier is enabled after a certain time has elapsed, the logic value "1" is output in case that the data is destructed while the logic value "0" is output in case that the data is not destructed.

As aforementioned, after the sensing amplifier outputs data, to recover the data to original data, the plate line becomes inert from high state to low state at the state that high signal is applied to the corresponding wordline.

The structure of the aforementioned related art nonvolatile ferroelectric memory device and a method for manufacturing the same will be described.

FIG. 4a is a layout of the related art nonvolatile ferroelectric memory device.

As shown in FIG. 4a, the related art nonvolatile ferroelectric memory device includes a first active region 41 and a second active region 41a which are asymmetrically formed spaced apart from each other, a second wordline W/L1 formed across the first active region 41, a second wordline W/L2 formed across the second active region 41a and spaced apart from the first wordline W/L1, a first bitline B/L1 formed across the first and second wordlines at one side of the first active region 41, a second bitline B/L2 formed across the first and second wordlines at one side of the second active region 41a, a first ferroelectric capacitor FC1 electrically connected with the first active region and formed over the first and second wordlines W/L1 and W/L2, a second ferroelectric capacitor FC2 electrically connected with the second active region 41a and formed over the first and second wordlines W/L1 and W/L2, a first plate line P/L1 electrically connected with the first ferroelectric capacitor FC1 and formed on the first wordline W/L1, and a second plate line P/L2 electrically connected with the second ferroelectric capacitor FC2 and formed on the second wordline W/L2.

FIG. 4a is a layout of the related art nonvolatile ferroelectric memory device based on unit cell. In such a related art nonvolatile ferroelectric memory device, the first and second capacitors FC1 and FC2 are formed along the bitline, the first plate line P/L1 is formed on the first wordline W/L1,and the second plate line P/L2 is formed on the second wordline W/L2.

The aforementioned related art nonvolatile ferroelectric memory device will be described in detail with reference to FIG. 4b.

FIG. 4b is a sectional view illustrating a related art nonvolatile ferroelectric memory device taken along line I–I' of FIG. 4a.

As shown in FIG. 4b, the related art nonvolatile ferroelectric memory device includes a substrate 51 in which an active region and a field region are defined, a first wordline 54 and a second wordline 54a which are formed on a first insulating layer 53 on the active region and the field region, first source/drain impurity regions 55 and 56 formed at both sides of the first wordline 54, second source/drain impurity regions (not shown) formed at both sides of the second wordline 54a, a second insulating layer 57 formed on an entire surface including the first and second wordlines 54 and 54a, having a contact hole to expose the first drain impurity region 56, a first plug layer 58a buried in the contact hole, a first metal layer 59 for connecting the first plug layer 58a with a first bitline(not shown), a third insulating layer 60 formed on the entire surface including the first metal layer 59, having a contact hole to expose the first source impurity region 55, a second plug layer 62 buried in the contact hole, a barrier metal layer 63 electrically connected with the second plug layer 62 and formed over the first wordline 54 and the second wordline 54a, a lower electrode 64 of the first ferroelectric capacitor FC1 formed on the barrier metal layer 63, a ferroelectric film 65 and an upper electrode 66 of the second ferroelectric capacitor which are sequentially deposited on the lower electrode 64 of the first ferroelectric capacitor, a fourth insulating layer 67 formed on the entire surface including the upper electrode 66 of the second ferroelectric capacitor, a first plate line 68 electrically connected with the upper electrode 66 of the first ferroelectric capacitor FC1 through the fourth insulating layer 67 and formed in a position corresponding to an upper side of the first wordline 54, and a second plate line 68a formed in a position corresponding to an upper side of the second wordline 54a and spaced apart from the first plate line 68.

The method for manufacturing the aforementioned related art nonvolatile ferroelectric memory device will be described with reference to FIGS. 5a to 5d.

FIGS. 5a to 5d are sectional views illustrating the method for manufacturing the related art nonvolatile ferroelectric memory device, taken along line I–I' of FIG. 4a.

As shown in FIG. 5a, the semiconductor substrate 51 is partially etched to form a trench and then an insulating layer is buried in the trench to form a device isolation layer 52.

A first insulating layer 53 is formed on a substrate 51 of an active region including the device isolation layer 52. A wordline material layer is formed on the first insulating layer 53 and then patterned to form first and second wordlines 54 and 54a spaced apart from each other.

As shown in FIG. 5b, source and drain impurity regions 55 and 56 having conductivity type opposite to the substrate 51 are formed by impurity ion implantation using the wordlines 54 and 54a as masks.

The source/drain impurity regions 55 and 56 are source/drain impurity regions of a first transistor Ti which uses the first wordline 54 as a gate electrode.

Afterwards, a second insulating layer 55 is formed on an entire surface of the substrate 51 including the first and second wordlines 54 and 54a. A photoresist(not shown) is then deposited on the second insulating layer 55 and then patterned. The second insulating layer 55 is selectively removed by etching process using the patterned photoresist as a mask to expose the drain impurity region 56 so that a contact hole 58 is formed.

As shown in FIG. 5c, a conductive material is buried in the contact hole to form a first plug layer 58a, and a first metal layer 59 for connecting the first plug layer 58a with the first bitline B/L1 is formed. At this time, the second bitline B/L2 is electrically connected with the drain impurity region of a second transistor T2 (not shown).

Subsequently, as shown in FIG. 5d, a third insulating layer 60 is formed on the entire surface including the first metal layer 59. A photoresist(not shown) is deposited on the third insulating layer 60 and then patterned. The third insulating layer 60 is selectively removed by etching process using the patterned photoresist as a mask to expose the source impurity region 55 so that a contact hole 61 is formed.

As shown in FIG. 5e, the conductive material is buried in the contact hole 61 to form a second plug layer 62 electrically connected with the source impurity region 55.

A barrier metal layer 63 is then formed to be electrically connected with the second plug layer 62. A lower electrode 64 of a first ferroelectric capacitor FC1, a ferroelectric film 65, and an upper electrode 66 of the first ferroelectric capacitor are sequentially formed on the barrier metal layer 63.

As shown in FIG. 5f, a fourth insulating layer 67 is formed on the upper electrode 66 of the first ferroelectric capacitor. The fourth insulating layer 67 is then selectively etched by photolithography process to partially expose the upper electrode 66 of the first ferroelectric capacitor so that a contact hole is formed. Finally, a first plate line 68 electrically connected with the upper electrode 66 of the first ferroelectric capacitor through the contact hole is formed. As a result, the method for manufacturing the related art nonvolatile ferroelectric memory device is completed. A reference numeral "68a" which is not described denotes a second plate line.

However, the related art nonvolatile ferroelectric memory device and the method for manufacturing the same have several problems.

To ensure the capacitance, the lower electrode of the capacitor requires a thick thickness. However, in case that the lower electrode of the capacitor is too thickly formed, it is difficult to etch the lower electrode of the capacitor made of metal material. For this reason, there is limitation to ensure the capacitance.

In addition, since the wordline and the plate line are formed in unit cell, a space for forming the plate line is not ensured sufficiently, in which the wordline of an adjacent cell and the plate line are separated from each other. Therefore, since the plate line is formed in such a narrow space, difficult process steps are caused.

SUMMARY OF THE INVENTION

Accordingly, the present invention is directed to a nonvolatile ferroelectric memory device and a method for manufacturing the same, that substantially obviate one or more of the problems due to limitations and disadvantages of the related art.

An object of the present invention is to provide a nonvolatile ferroelectric memory device and a method for manufacturing the same, which increase capacitance by ensuring an area of a capacitor to the maximum degree and simplify process steps by facilitating layout design.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nonvolatile ferroelectric memory device according to the present invention includes first and second split wordlines formed at a certain interval in one direction, first and second bitlines formed across the first and second split wordlines at a certain interval, first and second source/drain impurity regions respectively formed at both sides of the first and second split wordlines, a first ferroelectric capacitor formed on the second split wordline, having a lower electrode electrically connected with the first source impurity region and an upper electrode connected with the second split wordline, and a second ferroelectric capacitor formed on the first split wordline, having a lower electrode electrically connected with the second source impurity region and an upper electrode connected with the first split wordline.

In another aspect, a method for manufacturing a nonvolatile ferroelectric memory device according to the present invention includes the steps of asymmetrically defining first and second active regions, forming first and second split wordlines across the respective active regions, forming first and second plug layers to be respectively connected with one sides of the first and second active regions and to be respectively extended to regions where first and second bitlines are to be formed, forming first and second bitlines respectively connected with the first and second plug layers, forming third and fourth plug layers respectively connected with other sides of the first and second active regions, forming a lower electrode of a first ferroelectric capacitor on the second split wordline to be connected with the third plug layer and forming a lower electrode of a second ferroelectric capacitor on the first split wordline, forming a first ferroelectric film on the lower electrode of the first ferroelectric capacitor, forming a second ferroelectric film on the lower electrode of the second ferroelectric capacitor, forming an upper electrode of the first ferroelectric capacitor on the first ferroelectric film, and forming an upper electrode of the second ferroelectric capacitor on the second ferroelectric film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4a is a layout of a related art nonvolatile ferroelectric memory device;

FIG. 4b is a sectional view taken along line I–I' of FIG. 4a;

DETAILED DESCRIPTION OF THE PREFERRED EMBODIMENTS

Reference will now be made in detail to the preferred embodiments of the present invention, examples of which are illustrated in the accompanying drawings.

A nonvolatile ferroelectric memory device and a method for manufacturing the same according to the present invention will be described with the accompanying drawings.

Figure 1:
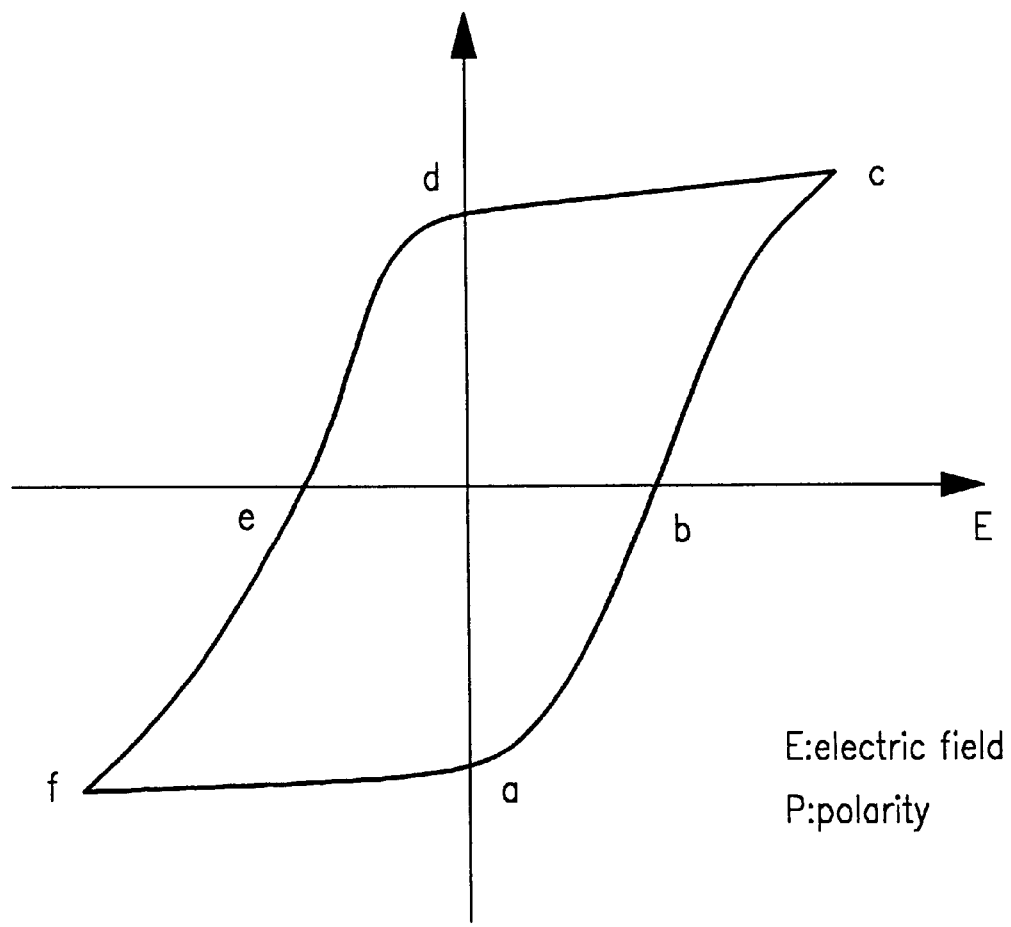
FIG. 1 shows hysteresis loop of a general ferroelectric.
Figure 2:
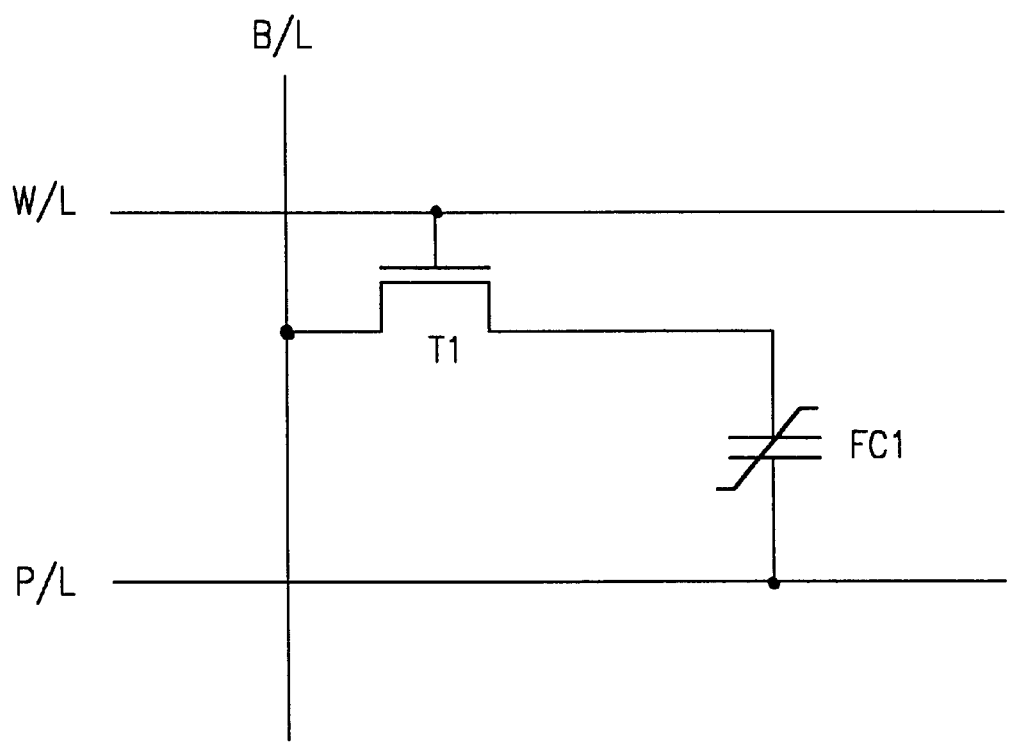
FIG. 2 is a circuit diagram of a related art nonvolatile ferroelectric memory device.
Figure 3A:
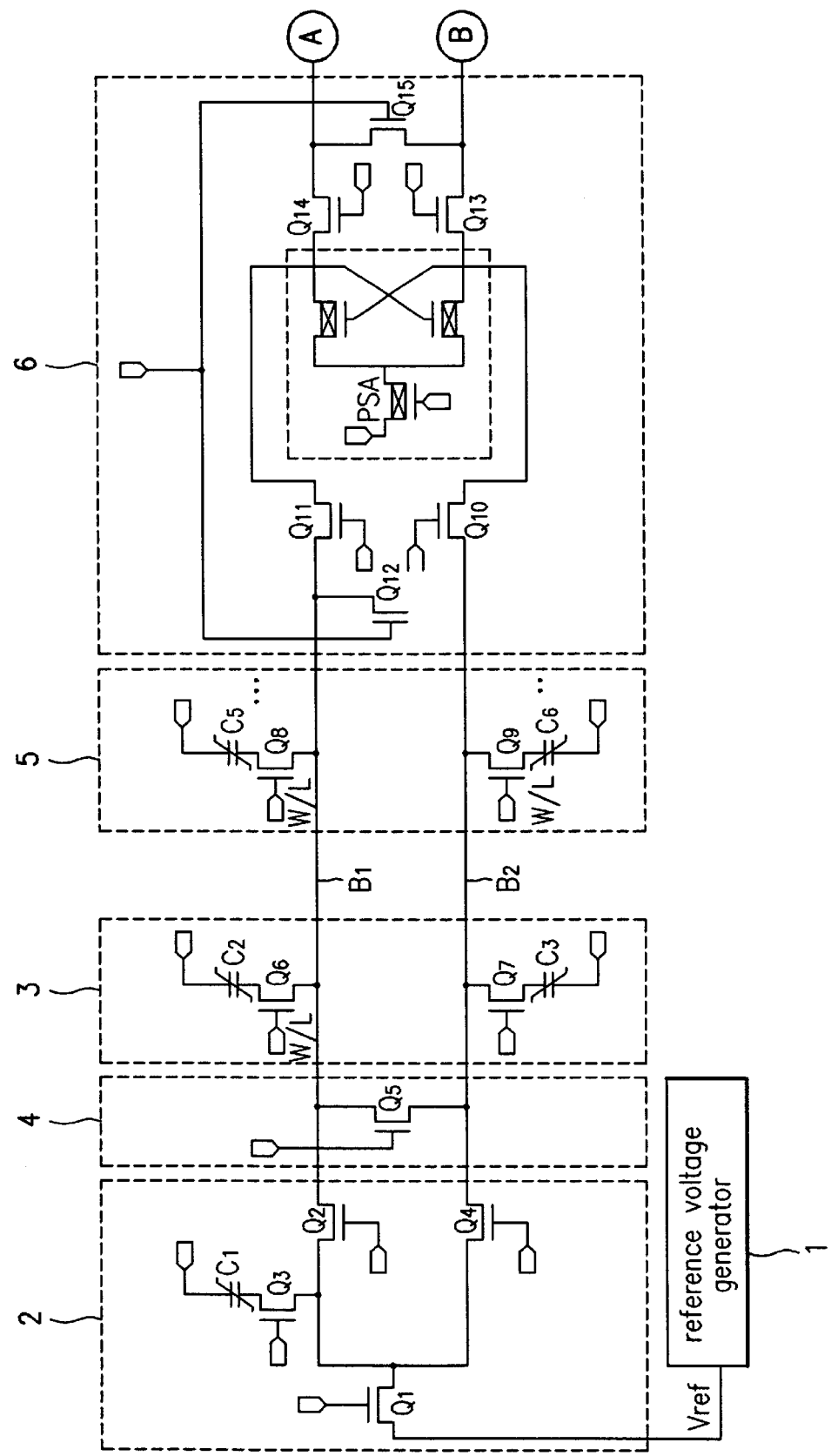
FIGS. 3a and 3b are driving circuits of a related art nonvolatile ferroelectric memory device.
Figure 3B:
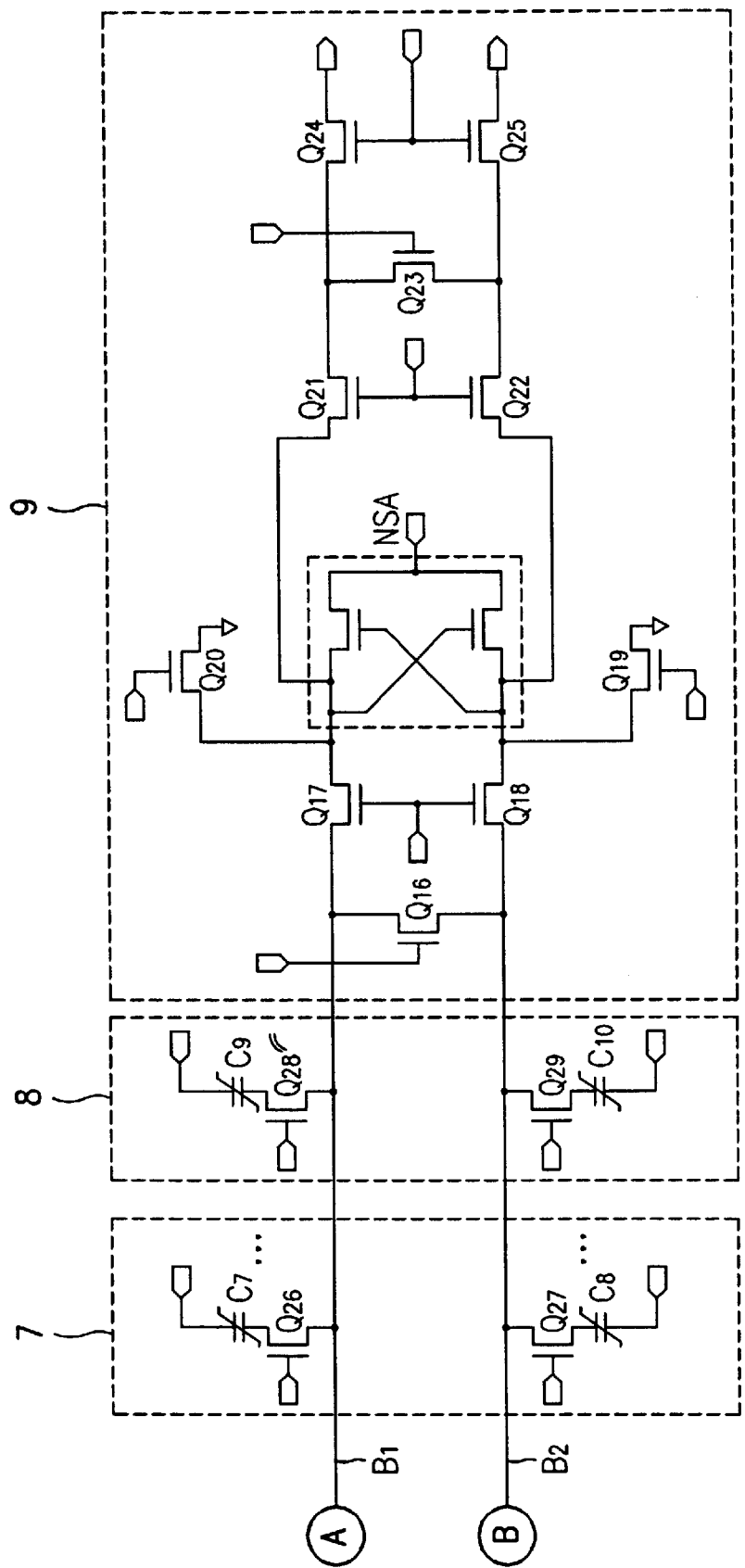
Figure 4B:
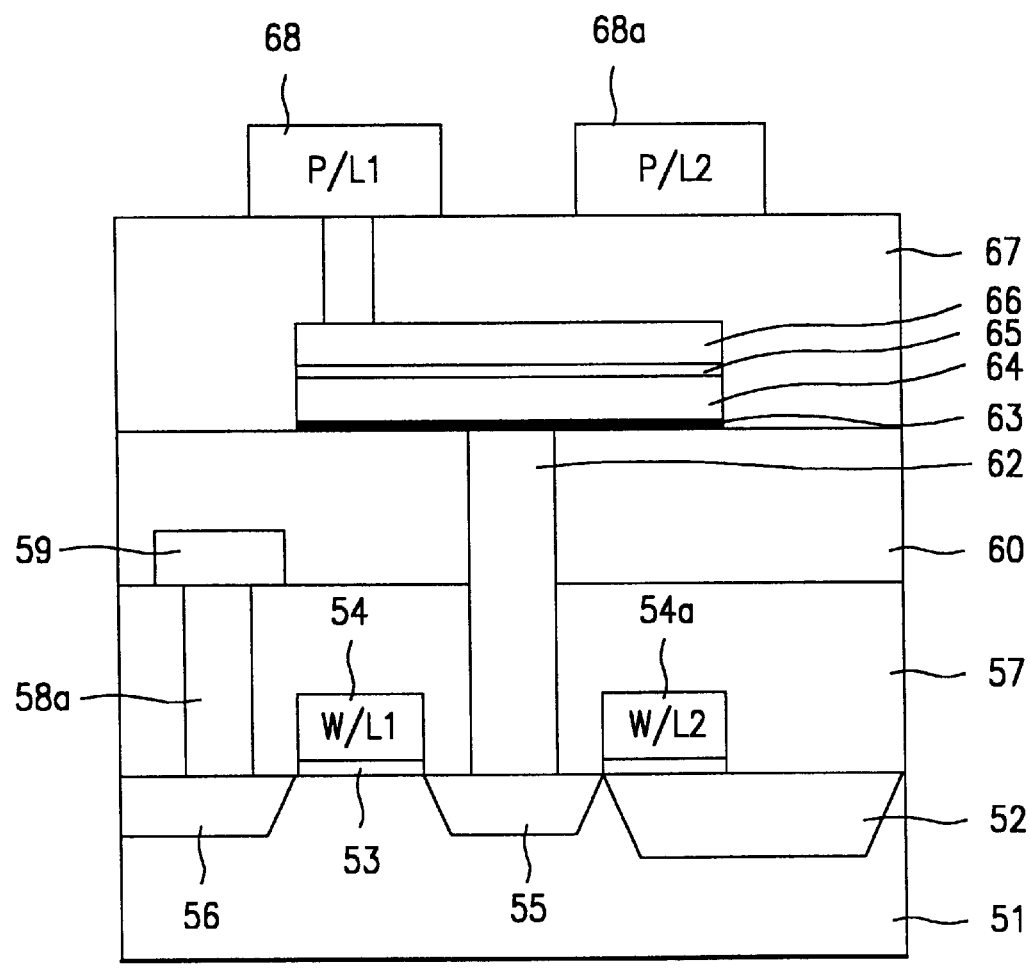
Figure 5A:
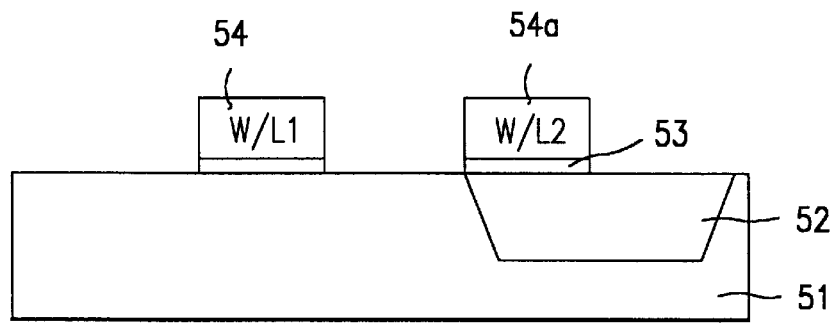
FIGS. 5a to 5f sectional views illustrating a related art method for manufacturing a nonvolatile ferroelectric memory device.
Figure 5B:
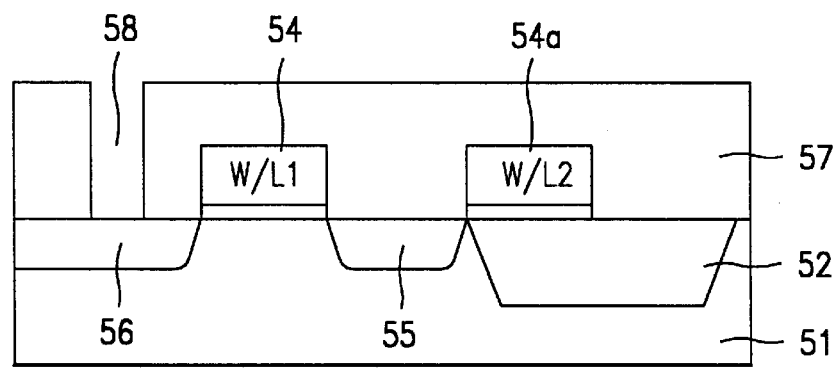
Figure 5C:
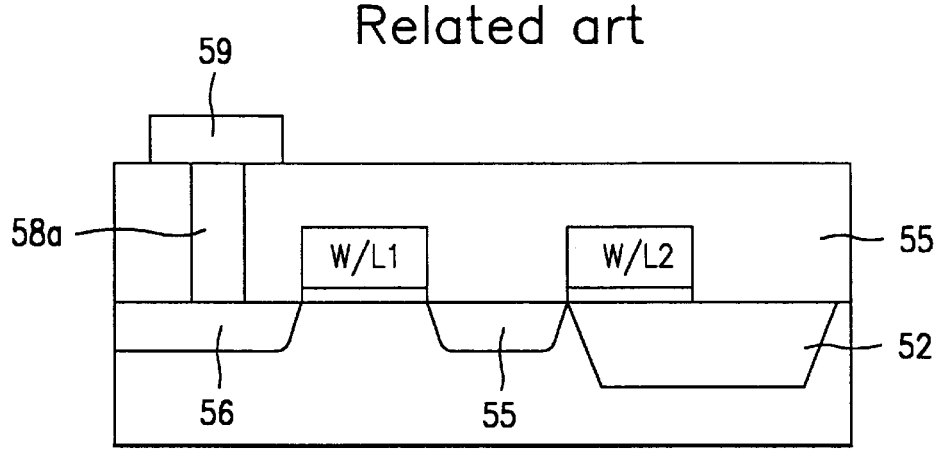
Figure 5D:
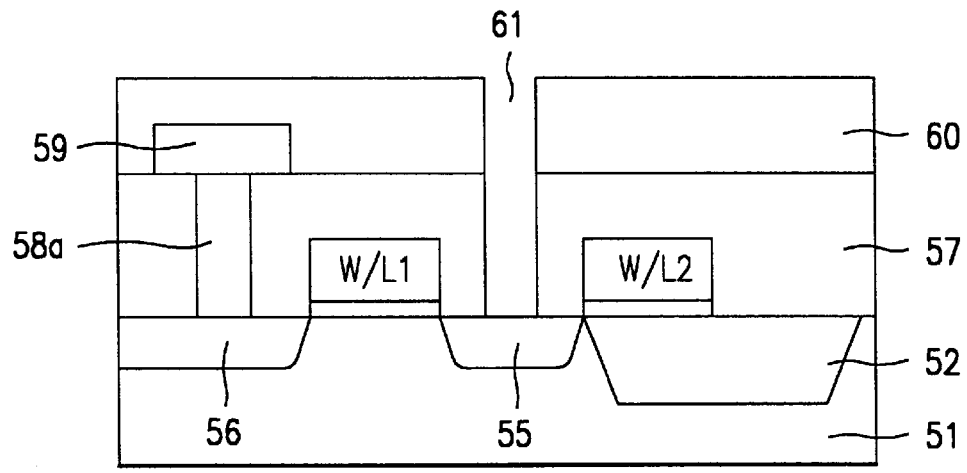
Figure 5E:
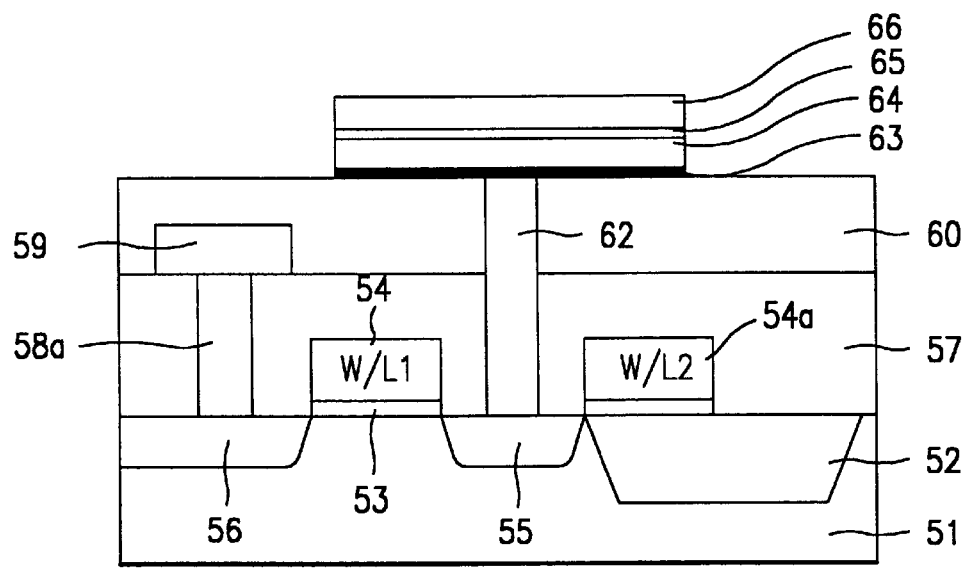
Figure 5F:
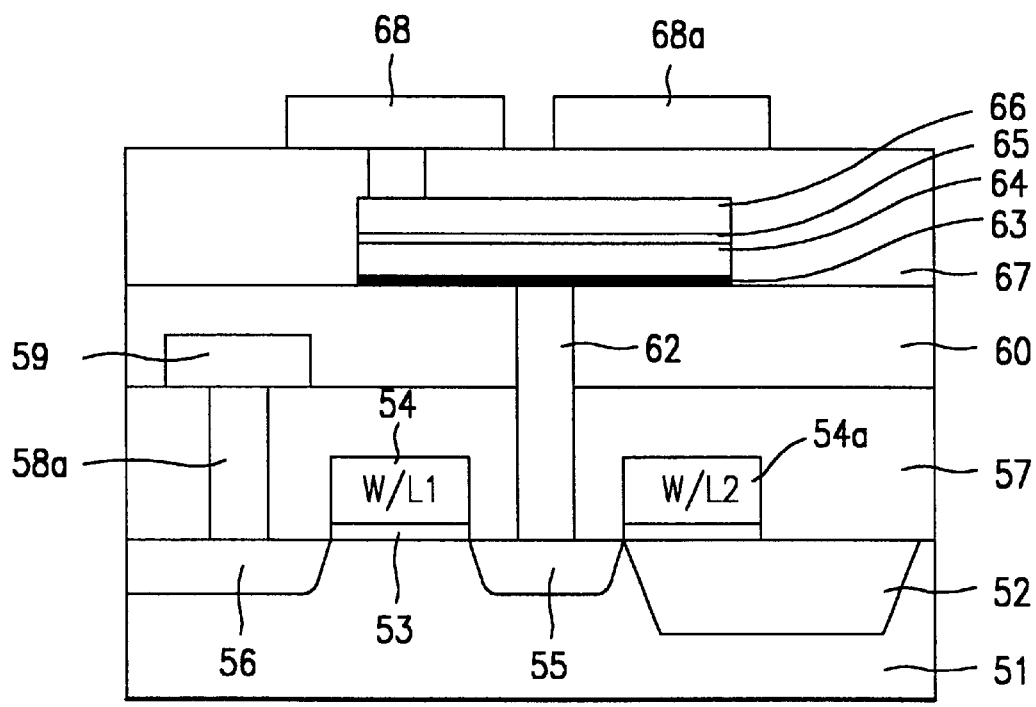
Figure 6:
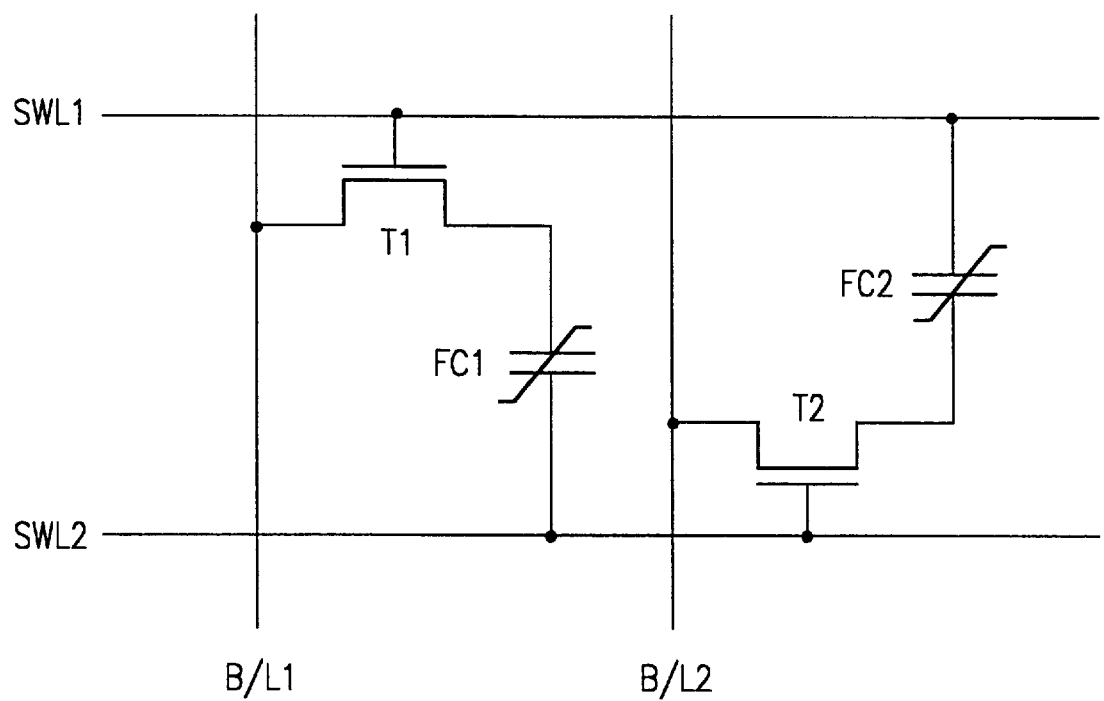
FIG. 6 is a circuit diagram of a nonvolatile ferroelectric memory device according to the present invention.

FIG. 6 is a circuit diagram of a nonvolatile ferroelectric memory device according to the present invention.

As shown in FIG. 6, the nonvolatile ferroelectric memory device according to the present invention includes first and second split wordlines SWL1 and SWL2 formed in row direction at a certain interval, first and second bitlines B/L1 and B/L2 formed across the first and second split wordlines SWL1 and SWL2, a first transistor T1 whose gate is connected with the first split wordline SWL1 and drain is connected with the first bitline B1, a first ferroelectric capacitor FC1 connected between a source of the first transistor T1 and the second split wordline SWL2, a second transistor T2 whose gate is connected with the second split wordline SWL2 and drain is connected with the second bitline B2, and a second ferroelectric capacitor FC2 connected between a source of the second transistor T2 and the first split wordline SWL1.

Figure 7:
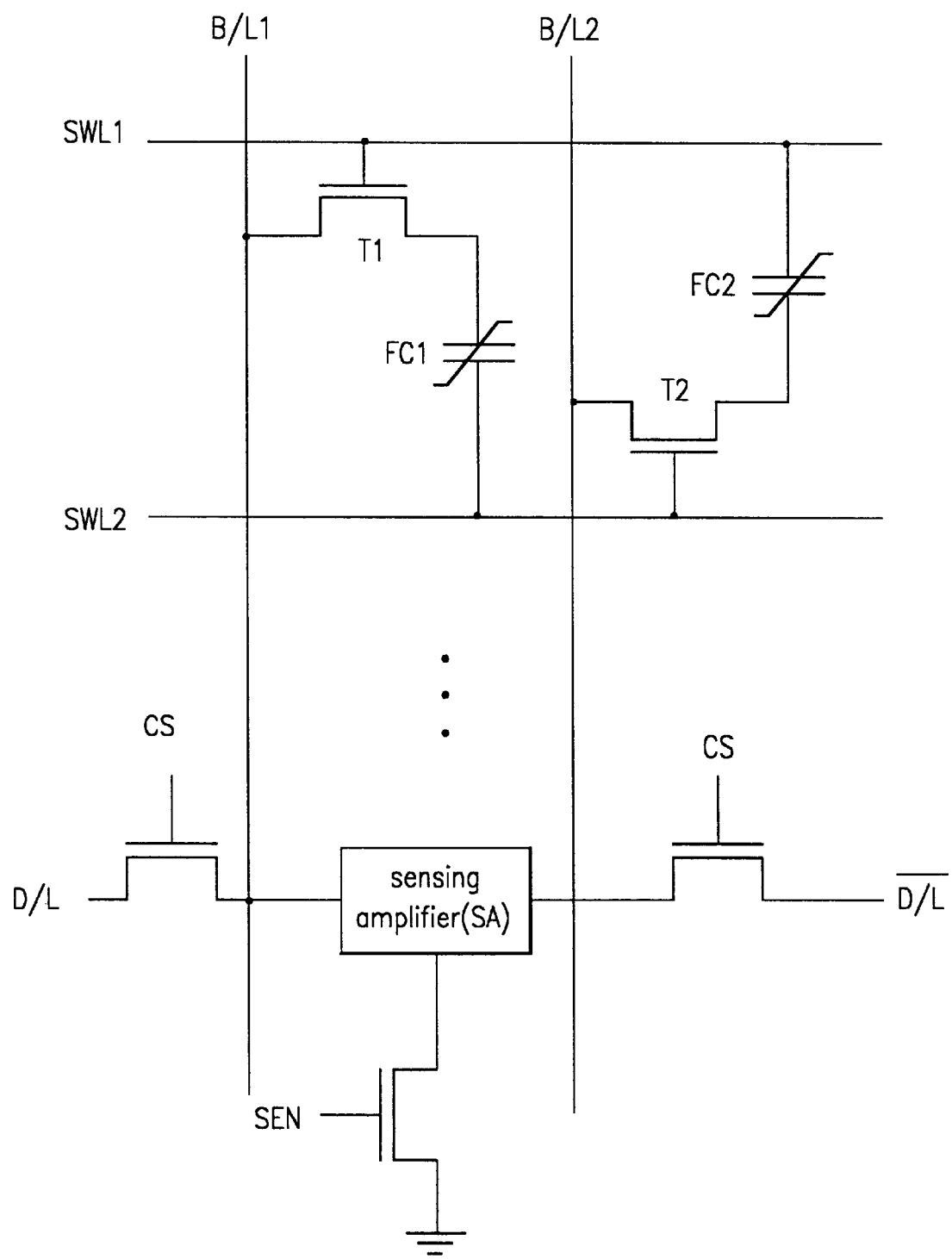
FIG. 7 is a circuit diagram of a nonvolatile ferroelectric memory device according to the present invention.

FIG. 7 is a circuit diagram illustrating a nonvolatile ferroelectric memory device.

As shown in FIG. 7, a plurality of split wordline pairs including first and second split wordlines SWL1 and SWL2 in pairs are formed in row direction. A plurality of bitlines B/L1 and B/L2 including two adjacent bitlines in pairs are formed across the split wordline pairs. Sensing amplifiers SA are formed between the pair of bitline, which sense data transferred through the bitlines and transfer the data to a data line DL or a data bar line /DL. At this time, an enable portion SEN for enabling the sensing amplifiers SA and a selection switching portion CS for selectively switching bitlines and data lines are further provided.

The operation of the nonvolatile ferroelectric memory device according to the present invention will be described with reference to a timing chart shown in FIG. 8.

Figure 8:
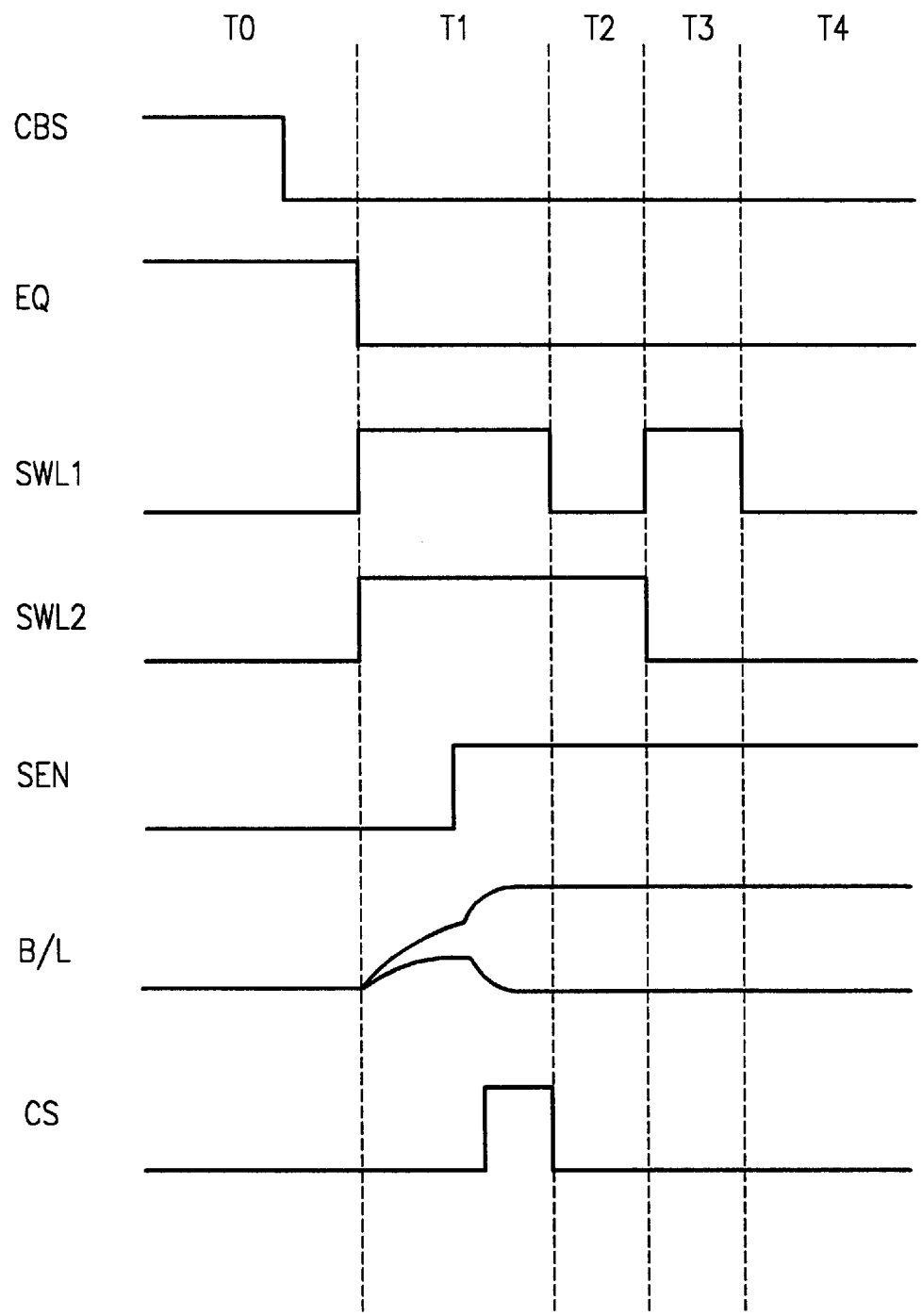
FIG. 8 is a timing chart illustrating operation of a nonvolatile ferroelectric memory device according to the present invention.

T0 period in FIG. 8 denotes a period before the first split wordline SWL1 and the second split wordline SWL2 are activated to "high(H)". In this T0 period, all of bitlines are precharged at a certain level.

T1 period denotes a period that the first and second split wordlines SWL1 and SWL2 are all to become "H". In this T1 period, data of the ferroelectric capacitor are transferred to the bitline so that the bitline level is varied.

At this time, in case of the ferroelectric capacitor having a logic value "high", since electric fields having opposite polarities are applied to the bitline and the split wordline, polarity of the ferroelectric is destructed, so that a large amount of current flows, thereby organizing high voltage in the bitline.

On the other hand, in case of the ferroelectric capacitor having a logic value "low", since electric field having the same polarities are applied to the bitline and the split wordline, polarity of the ferroelectric is not destructed, so that a small amount of current flows, thereby organizing low voltage in the bitline.

If the cell data are loaded in the bitline sufficiently, the sensing amplifier enable signal SEN is transited to high so as to activate the sensing amplifier. As a result, the bitline level is amplified.

Meanwhile, since the logic data "H" of the destructed cell can not be restored at the state that the first and second split wordlines SWL1 and SWL2 are high, the data can be restored in T2 and T3 periods.

Subsequently, in T2 period, the first split wordline SWL1 is transited to low, the second split wordline SWL2 is maintained at high state, and the second transistor T2 is turned on. At this time, if the corresponding bitline is high, high data is transferred to one electrode of the second ferroelectric capacitor FC2 so that the logic value "1" is restored between low state of the first split wordline SWL1 and high state of the bitline.

In T3 period, the first split wordline SWL1 is transited to high, the second split wordline SWL2 is transited to low, and the first transistor T1 is turned on. At this time, if the corresponding bitline is high, high data is transferred to one electrode of the first ferroelectric capacitor FC1 so that logic value "1" is restored between high level of the second split wordline SWL2.

Figure 9:
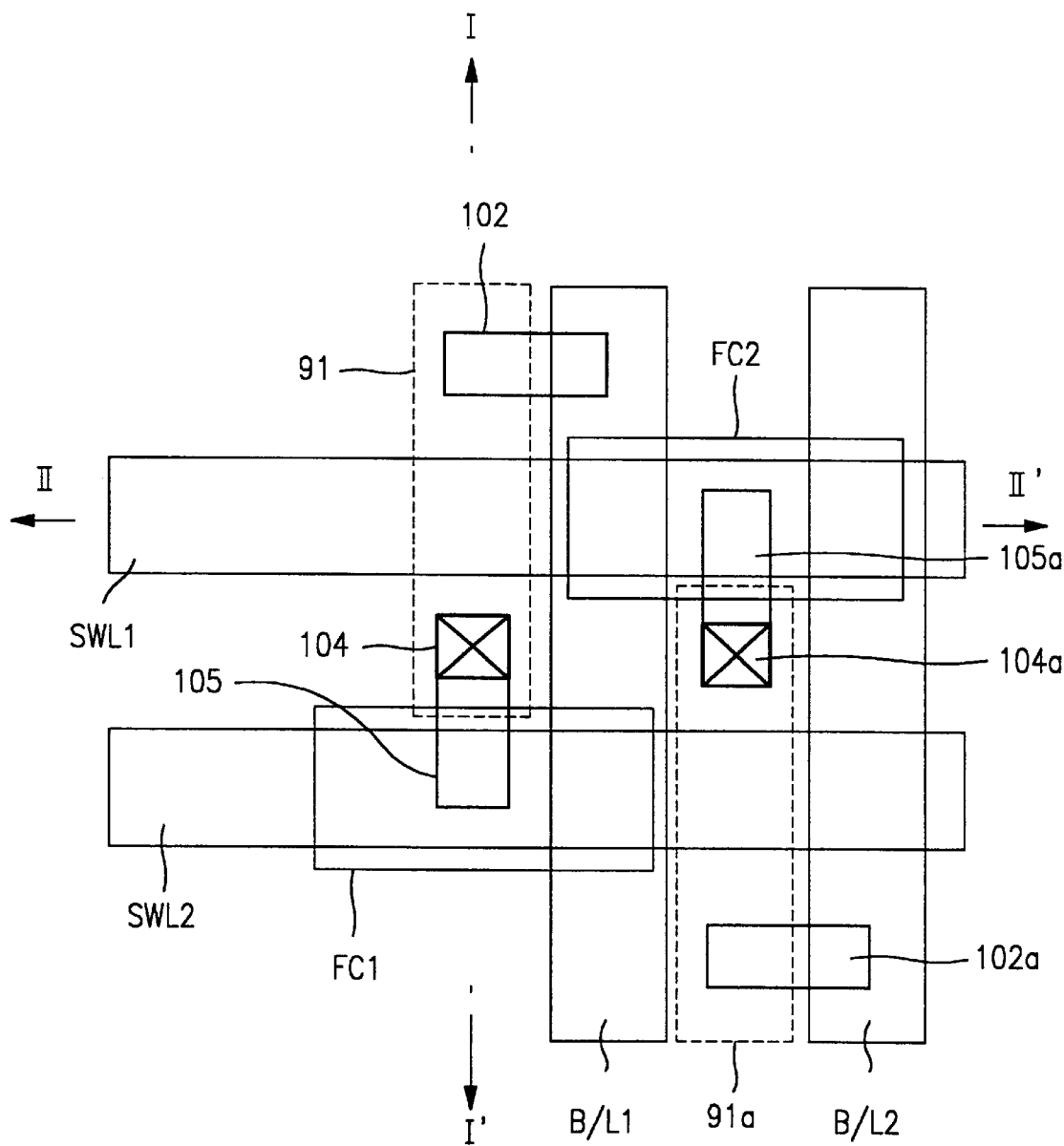
FIG. 9 is a layout of a nonvolatile ferroelectric memory device according to the present invention.

FIG. 9 is a layout of a nonvolatile ferroelectric memory device according to the present invention.

As shown in FIG. 9, the nonvolatile ferroelectric memory device includes first and second active regions 91 and 91a asymmetrically formed at a certain interval, a first split wordline SWL1 formed across the first active region 91, a second split wordline SWL2 formed across the second active region 91a, a first bitline B/L1 formed on the field region between the first and second active regions 91 and 91a across the first and second split wordlines SWL1 and SWL2, a second bitline B/L2 formed on the field region at one side of the second active region 91a across the first and second split wordlines SWL1 and SWL2, a first ferroelectric capacitor FC1 formed on the second split wordline SWL2 adjacent to the first active region 91, and a second ferroelectric capacitor FC2 formed on the first split wordline SWL1, adjacent to the first and second bitlines B/L1 and B/L2 and formed therebetween.

The first split wordline SWL1 acts as a gate electrode of the first transistor T1 and the second split wordline SWL2 acts as a gate electrode of the second transistor T2.

The lower electrode of the first ferroelectric capacitor FC1 is electrically connected with the first active region 91 and the lower electrode of the second ferroelectric capacitor FC2 is electrically connected with the active region 91a.

The upper electrode of the first ferroelectric capacitor FC1 is electrically connected with the second split wordline SWL2 and the upper electrode of the second ferroelectric capacitor FC2 is electrically connected with the first split wordline SWL1.

Sources of the first and second transistors T1 and T2 are electrically connected with the lower electrode of the first ferroelectric capacitor FC1 and the lower electrode of the second ferroelectric capacitor FC2 through the first plug layers 102 and 102a, respectively.

Drains of the first and second transistors T1 and T2 are electrically connected with the first and second bitlines B/L1 and B/L2.

Figure 10A:
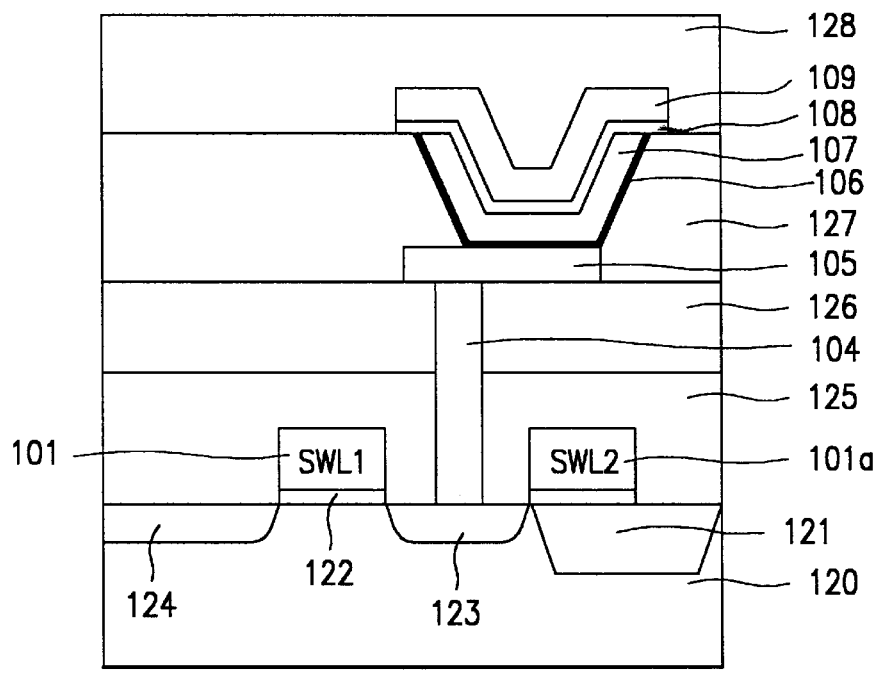
FIG. 10a is a sectional view taken along line I–I' of FIG. 9

Meanwhile, FIG. 10a is a sectional view of a nonvolatile ferroelectric memory device according to the present invention, taken along line I–I' of FIG. 9.

As shown in FIG. 10a, the nonvolatile ferroelectric memory device according to the present invention includes a first conductivity type semiconductor substrate 120 in which an active region is defined by a device isolation layer 121, first and second split wordlines (SWL1, SWL2) 101 and 101a formed on a first insulating layer 122, which is formed on the semiconductor substrate 120 of the active region including the device isolation layer 121, at a certain interval in one direction, first source/drain impurity regions 123 and 124 formed in the substrate at both sides of the first split wordline (SWL1) 101, a second insulating layer 125 formed on an entire surface including the first and second split wordlines 101 and 101a, a first plug layer 102 in contact with the first drain impurity region 124 passing through the second insulating layer 125 and extended to a portion, where a first bitline B/L1 will be formed, to be electrically connected with the first bitline B/L1 (not shown), a third insulating layer 126 formed on the entire surface including the first plug layer 102, a third plug layer 104 electrically connected with the first source impurity region 123 passing through the third and second insulating layers 126 and 125, a first pad layer 105 electrically connected with the third plug layer 104, a fourth insulating layer 127 having a trench to expose the first pad layer 105, a first barrier metal layer 106 formed below and at a side of the trench and connected with the first pad layer 105, a lower electrode 107 of the first ferroelectric capacitor formed on the first barrier metal layer 106, a first ferroelectric film 108 formed on the lower electrode 107 of the first ferroelectric capacitor, an upper electrode 109 of the first ferroelectric capacitor formed on the first ferroelectric film 108, and a fifth insulating layer 128 formed on the entire surface including the upper electrode 109 of the first ferroelectric capacitor.

The second split wordline (SWL2) 101a and the upper electrode 109 of the first ferroelectric capacitor are electrically connected with each other through a metal at a peripheral area not a cell area.

In the aforementioned nonvolatile ferroelectric memory device, the first ferroelectric capacitor FC1 is formed on the second split wordline SWL2 along a direction in which the second split wordline SWL2 is formed.

Since the lower electrode 107 of the first ferroelectric capacitor FC1 is formed below the trench and at both sides of the trench, it is possible to increase capacity of the capacitor.

Figure 10B:
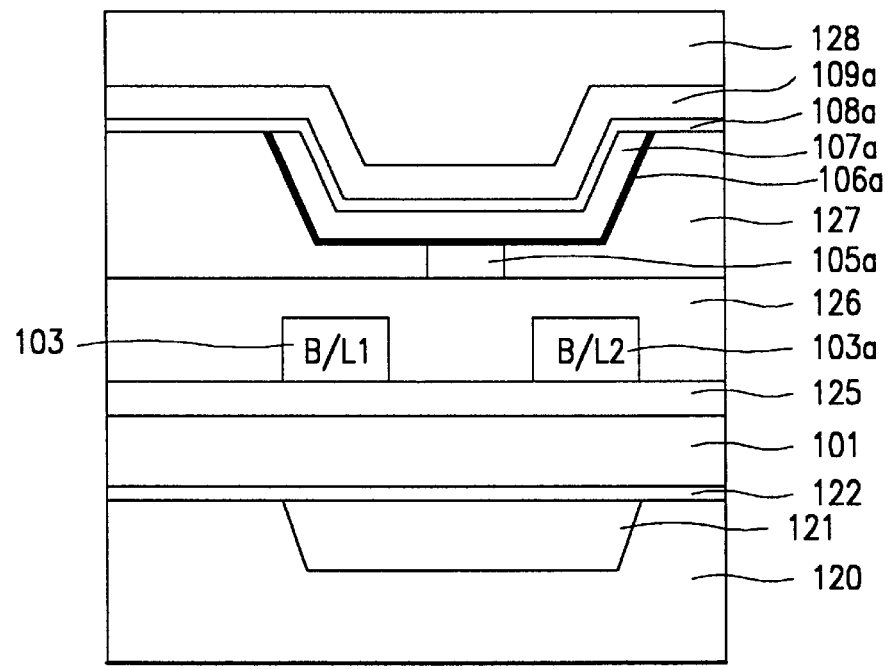
FIG. 10b is a sectional view taken along line II–II' of FIG. 9.

FIG. 10b is a sectional view taken along line II–II' of FIG. 9.

As shown in FIG. 10b, the nonvolatile ferroelectric memory device includes a first conductivity type semiconductor substrate 120 in which an active region is defined by a device isolation layer 121, a first insulating layer 122 formed on the semiconductor substrate 120, a first split wordline (SWL1) 101 formed on the first insulating layer 122, a second insulating layer 125 formed on the first split wordline SWL1, a first and second bitlines (B/L1, B/L2) 103 and 103a formed on the second insulating layer 125 corresponding to the device isolation layer 121, at a certain interval in one direction, a third insulating layer 126 formed on the entire surface including the first and second bitlines, a second pad layer 105a formed on the third insulating layer 126 between the first and second bitlines, a fourth insulating layer 127 formed on the entire surface including the second pad layer 105a, having a trench to expose the second pad layer 105a, a second barrier metal layer 106a formed along the lower side and both sides of the trench and connected with the second pad layer 105a, a lower electrode 107a of the second ferroelectric capacitor formed on the second barrier metal layer 106a, a second ferroelectric film 108a formed on the lower electrode 107a of the second ferroelectric capacitor, an upper electrode 109a of the second ferroelectric capacitor formed on the second ferroelectric film 108a, and a fifth insulating layer 128 formed on the entire surface including the upper electrode 109a of the second ferroelectric capacitor.

The first split wordline SWL1 and the upper electrode 109a of the second ferroelectric capacitor FC2 are electrically connected with each other through a metal at a peripheral area not a cell area.

In FIG. 10b, the second ferroelectric capacitor is formed on the first split wordline SWL1 along a direction in which the first split wordline SWL1 is formed.

A method for manufacturing the aforementioned nonvolatile ferroelectric memory device will be described in detail.

FIGS. 11a to 11g are layouts of a nonvolatile ferroelectric memory device according to the present invention, and FIGS. 12a to 12g are sectional views taken along line I–I' of FIGS. 11a to 11g.

Figure 11A:
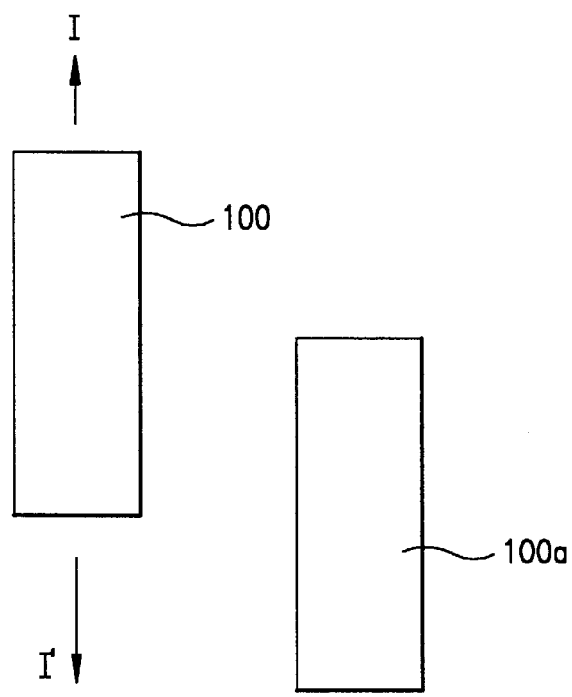
FIGS. 11a to 11i are layouts of a nonvolatile ferroelectric memory device according to the present invention.

As shown in FIG. 11a, active regions 100 and 100a are defined to be asymmetrically formed at a certain interval on a first conductivity type semiconductor substrate. A portion except for the active regions 100 and 100a is a field region (device isolation layer) and is formed by trench isolation process.

Figure 11B:
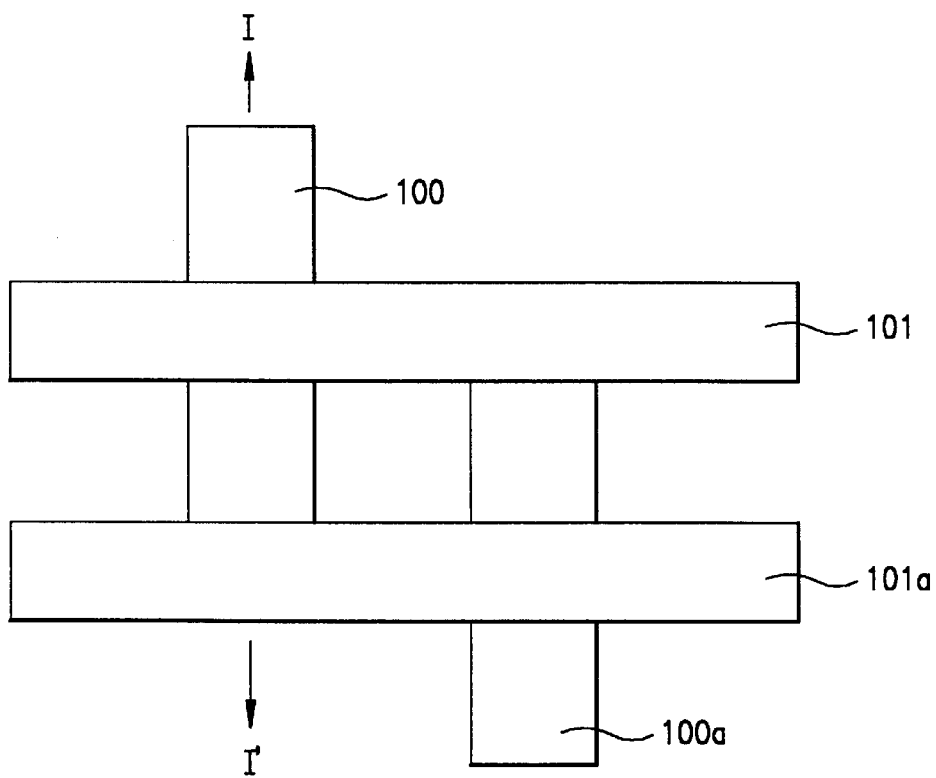

As shown in FIG. 11b, the first and second split wordlines (SWL1 and SWL2) 101 and 101a are formed across the active regions 100 and 100a to divide the active regions into two.

At this time, the first split wordline SWL1 acts as a gate electrode of the first transistor T1 and the second split wordline SWL2 acts as a gate electrode of the second transistor T2.

Impurity ions having a conductivity type opposite to the substrate are implanted into the substrate at both sides of the first split wordline 101 to form first source/drain impurity regions. At the same time, the impurity ions are implanted into the substrate at both sides of the second split wordline 101a to form second source/drain impurity regions.

Figure 11C:
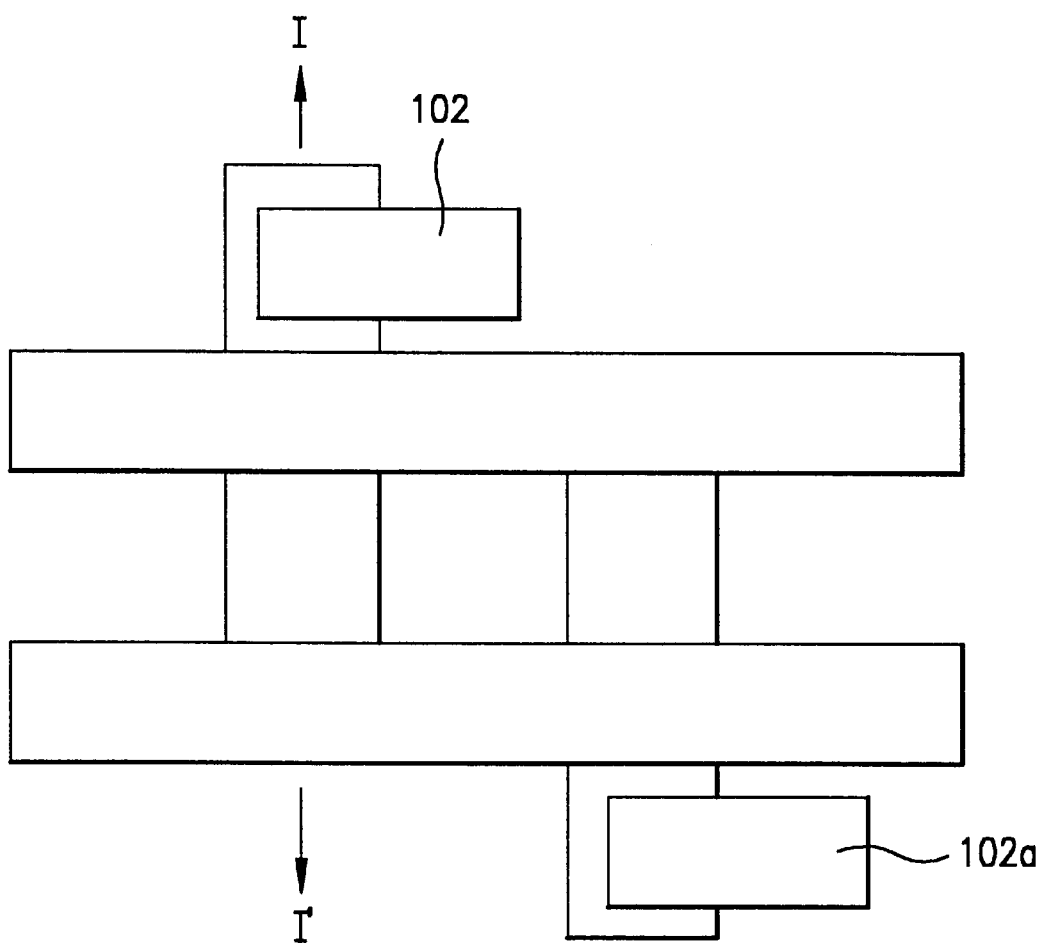

Subsequently, as shown in FIG. 11c, a first plug layer 102 and a second plug layer 102a are respectively formed. The first plug layer 102 is connected with the first drain impurity region and extended to a portion where a first bitline will be formed. The second plug layer 102a is connected with the second drain impurity region and extended to a portion where a second bitline will be formed.

In other words, since the bitlines are formed on the device isolation layer between the active regions 100 and 100a, the first and second plug layers 102 and 102a formed on the active regions are patterned to be extended to the device isolation layer.

Figure 11D:
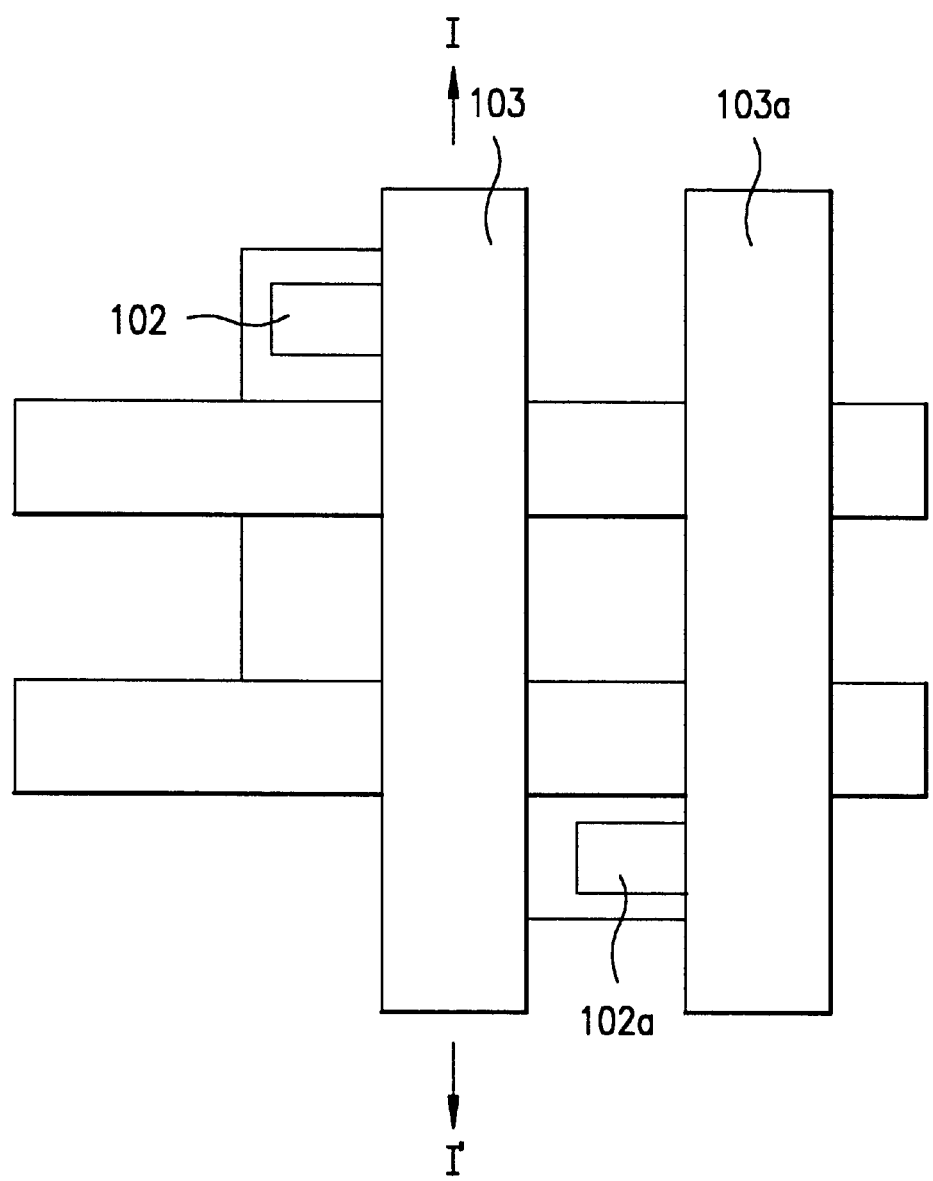

As shown in FIG. 11d, a first bitline (B/L1) 103 is formed at one side of the first active region 91 to be electrically connected with the first plug layer 102, and a second bitline (B/L2) 103a is formed at one side of the second active region 91a to be electrically connected with the second plug layer 102a.

Figure 11E:
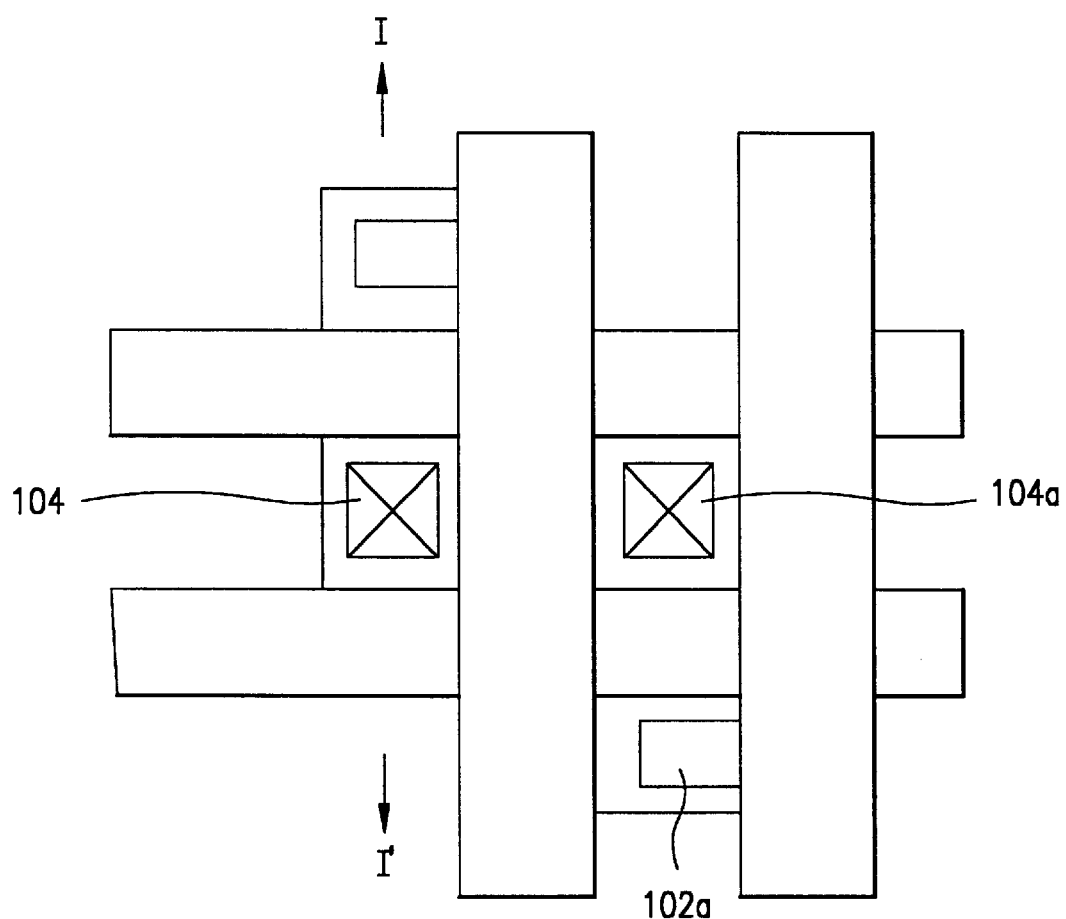

As shown in FIG. 11e, a third plug layer 104 and a fourth plug layer 104a are formed. The third plug layer 14 is electrically connected with the first source impurity region and the fourth plug layer 104a is connected with the second source impurity region.

Figure 11F:
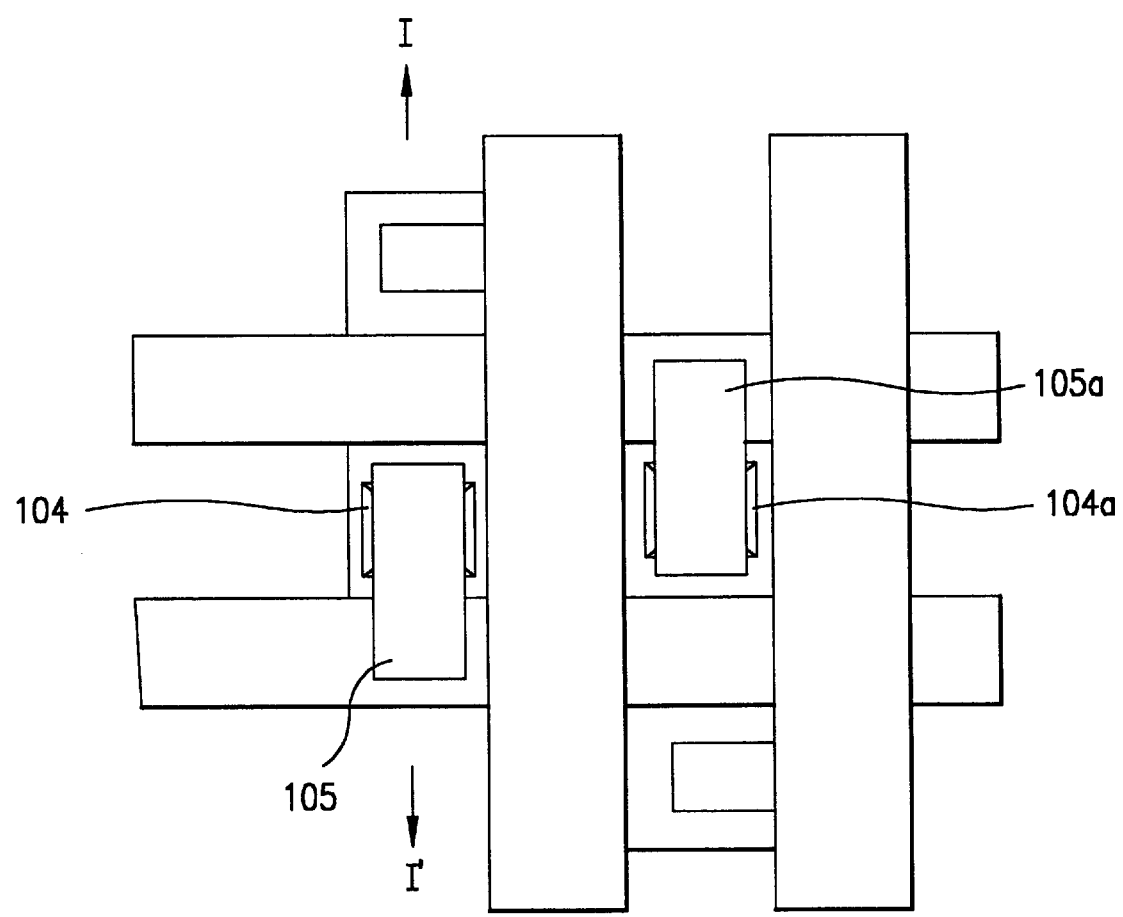

Subsequently, as shown in FIG. 11f, a first pad layer 105 is formed to be electrically connected with the third plug layer 104 and a lower electrode of the first ferroelectric capacitor FC1 which will be formed later. At the same time, a second pad layer 105a is formed to be electrically connected with the fourth plug layer 104a and a lower electrode of the second ferroelectric capacitor FC2 which will be formed later.

At this time, metal such as polysilicon or tungsten(W) is used as the first and second pad layers 105 and 105a.

Figure 11G:
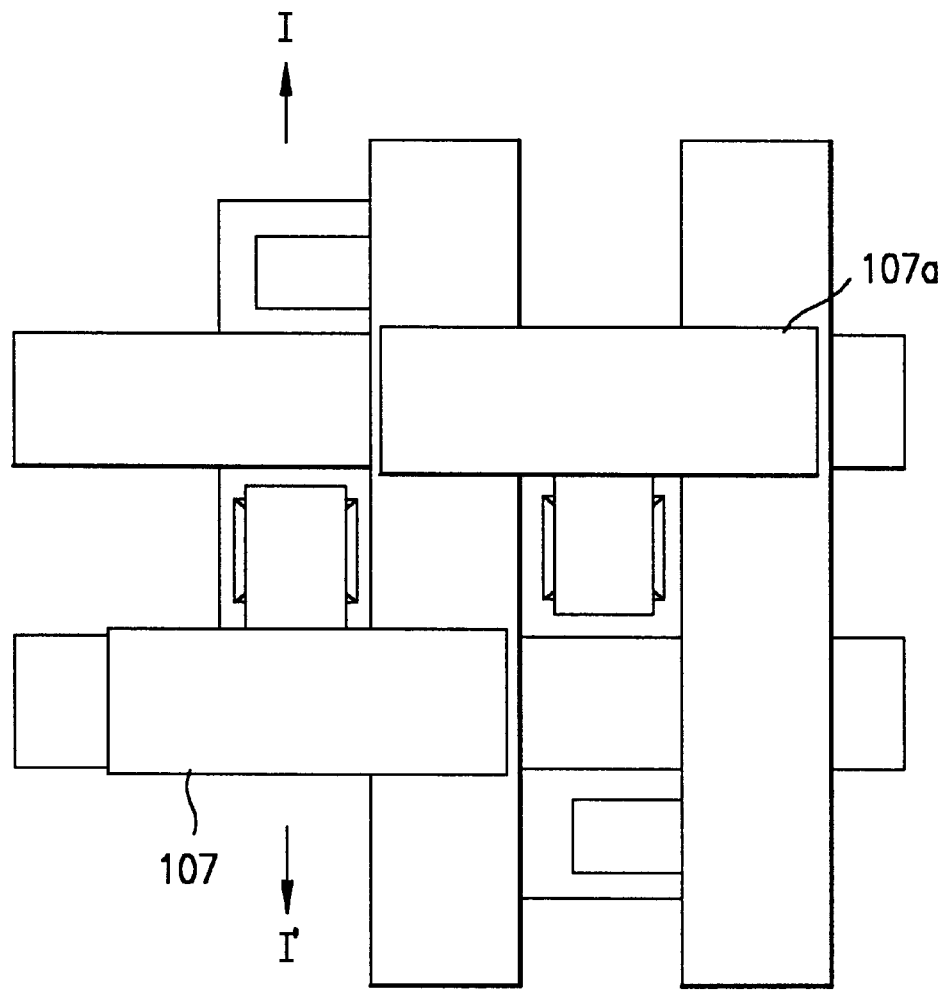

As shown in FIG. 11g, a first barrier metal layer 106 (not shown) is formed on the second split wordline 101a to be electrically connected with the second pad layer 105a. A second barrier metal layer 106a (not shown) is formed on the first split wordline 101 to be electrically connected with the first pad layer 105 and to overlap on the first and second bitlines 104 and 103a.

At this time, after forming the first and second pad layers 105 and 105a, an insulating layer (fourth insulating layer) is formed on the entire surface and then a trench is formed to expose the first and second pad layers 105 and 105a (not shown).

Afterwards, the lower electrode 107 of the first ferroelectric capacitor and the lower electrode 107a of the second ferroelectric capacitor are formed along the lower side and both sides of the trench to be respectively connected with the first and second barrier metal layers.

Figure 11H:
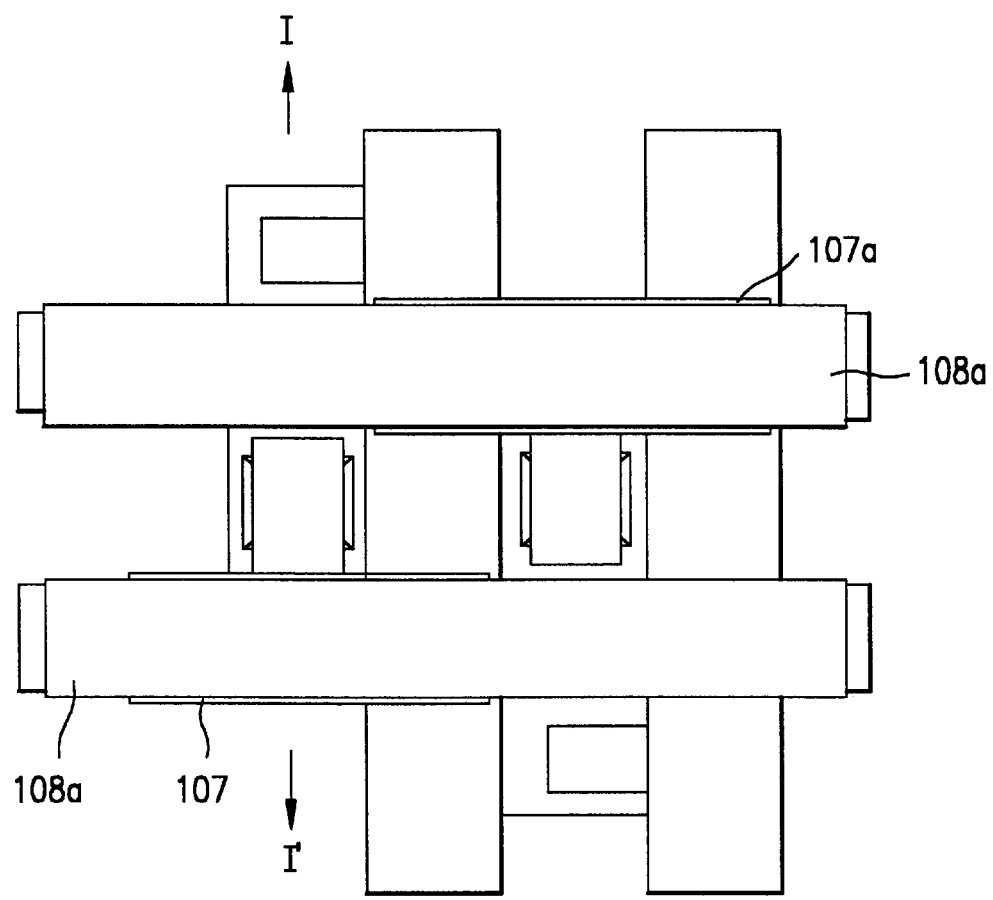

As shown in FIG. 11h, a ferroelectric film is formed on the entire surface including the lower electrodes 107 and 107a of the first and second ferroelectric capacitors. The first and second ferroelectric films 108 and 108a are respectively patterned on the first and second split wordlines.

Figure 11I:
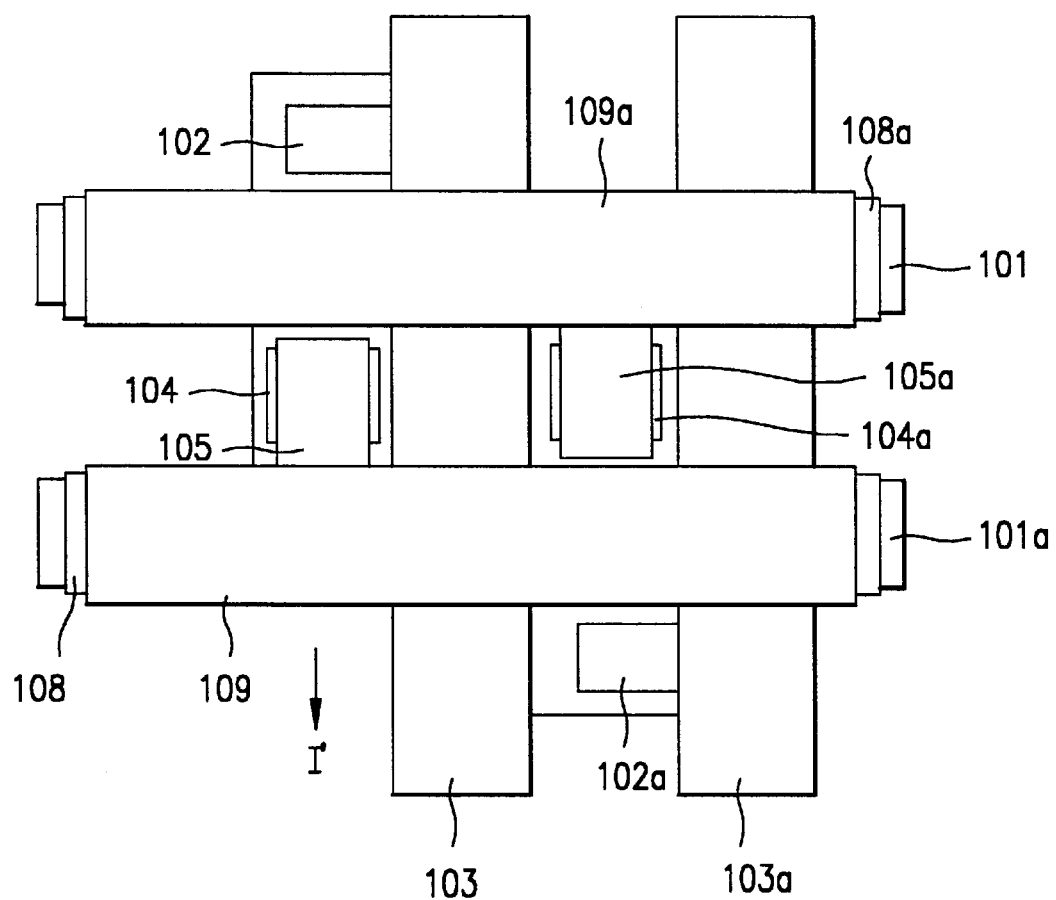

As shown in FIG. 11i, an upper electrode 109 of the first ferroelectric capacitor is formed on the first ferroelectric film 108 corresponding to the lower electrode of the first ferroelectric capacitor, and an upper electrode 109a of the second ferroelectric capacitor is formed on the second ferroelectric film 108a corresponding to the lower electrode 107a of the second ferroelectric capacitor.

A metal layer is then formed to electrically connect the upper electrode 109 of the first ferroelectric capacitor with the second split wordline 101a and the upper electrode 109a of the second ferroelectric capacitor with the first split wordline 101. As a result, layout design according to the nonvolatile ferroelectric memory device of the present invention is completed.

The method for manufacturing the nonvolatile ferroelectric memory device according to the aforementioned layout process will be described with reference to FIGS. 12a to 12j.

Figure 12A:
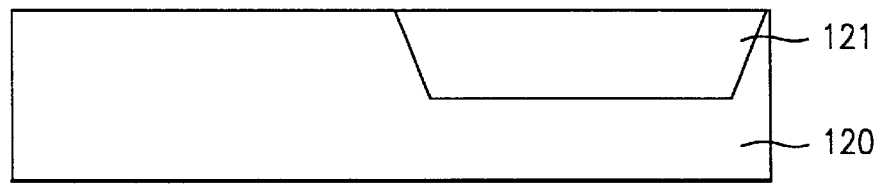
FIGS. 12a to 12i are sectional views illustrating a method for manufacturing a nonvolatile ferroelectric memory device taken along line I–I' of FIGS. 11a to 11i.

FIG. 12a is sectional view taken along line I–I' of FIG. 11a. A trench is formed in a predetermined region of a first conductivity type semiconductor substrate 120 to form a device isolation layer 121 buried in the trench.

Figure 12B:
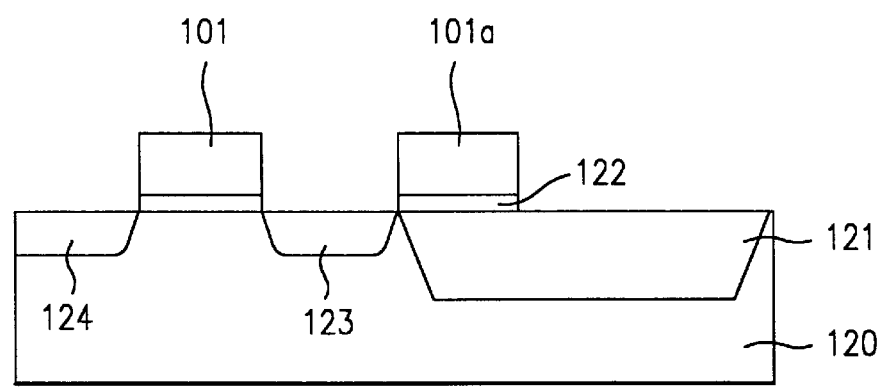

FIG. 12b is a sectional view taken along line I–I' of FIG. 11b. A first insulating layer 122 is formed on the substrate in which active regions are defined. Polysilicon is deposited on the first insulating layer 122 and then patterned to form first and second split wordlines (SWL1 and SWL2) 101 and 101a.

Impurity ions having conductivity types opposite to the substrate are implanted into the active regions at both sides of the first and second split wordlines 101 and 101a to form first and second source/drain impurity regions 123 and 124 (not shown).

The first split wordline (SWL1) 101 acts as a gate electrode of the first transistor T1 and the second split wordline (SWL2) 101a acts as a gate electrode of the second transistor T2.

A low resistance material such as tungsten.(W) is deposited on the first and second split wordlines 101 and 10a used as gate electrodes to reduce sheet resistance.

Figure 12C:
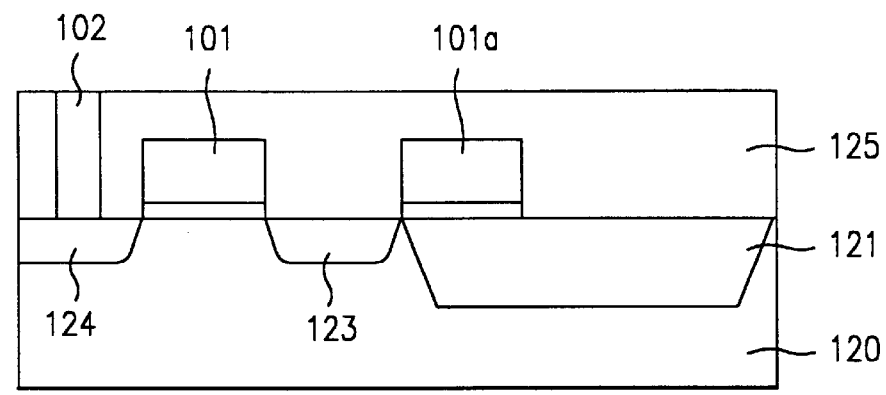

FIG. 12c is a sectional view taken along line I–I' of FIG. 11c. A second insulating layer 125 is deposited on the entire surface of the substrate including the first and second split wordlines 101 and 101a and then planarized by chemical mechanical polishing (CMP) process.

Subsequently, the second insulating layer 125 is selectively removed to expose the first drain impurity region 124 so that a contact hole is formed. A conductive material such as polysilicon or tungsten is buried in the contact hole to form a first plug layer (102) and a second plug layer(not shown).

The first plug layer 102 acts to electrically connect the first bitline which will be formed later with the first drain impurity region 124 and is extended to a portion where the bitline will be formed to be connected with the bitline.

Figure 12D:
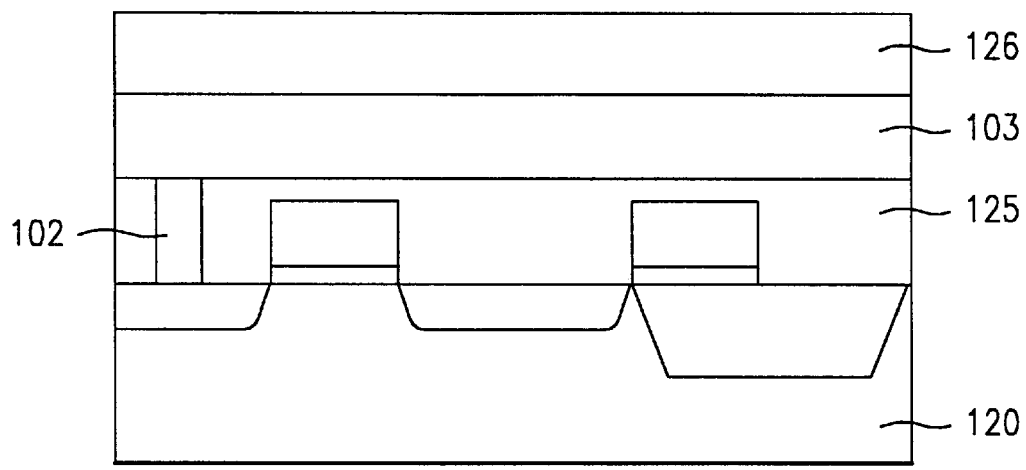

FIG. 12d is a sectional view taken along line I–I' of FIG. 11d. A metal for forming the bitline is deposited on the entire surface including the first plug layer 102 and then patterned to form a first bitline 103 and a second bitline 103a(not shown).

In the drawing, the first bitline 103 is only shown and is electrically with the first drain impurity region 124 through the first plug layer 102.

At this time, the first and second bitlines 103 and 103a are patterned to remain only on the device isolation layer 121. A third insulating layer 126 is formed on the entire surface including the first bitline 103 and then planarized by CMP process.

Figure 12E:
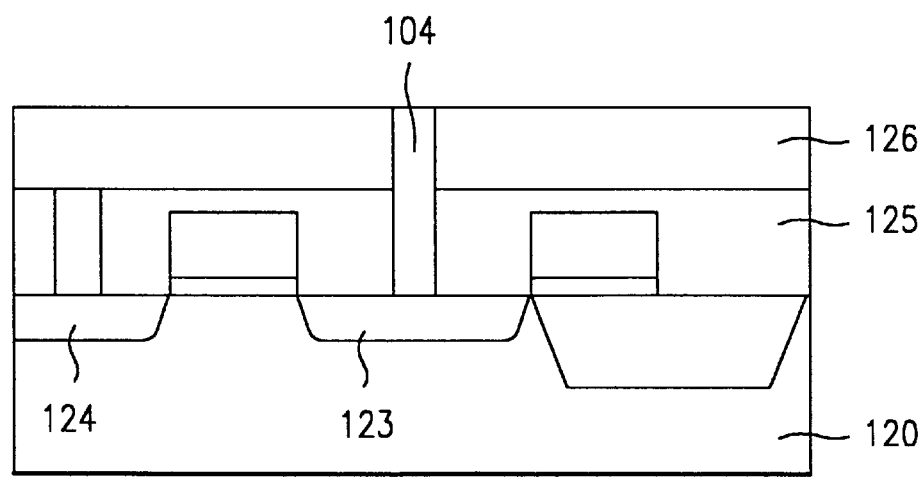

FIG. 12e is a sectional view taken along line I–I' of FIG. 11e. The third insulating layer 126 and the second insulating layer 125 are selectively removed to expose the first source impurity region 123 so that a contact hole is formed. A metal such as tungsten is buried in the contact hole to form a third plug layer 104 and a fourth plug layer 104a(not shown).

Figure 12F:
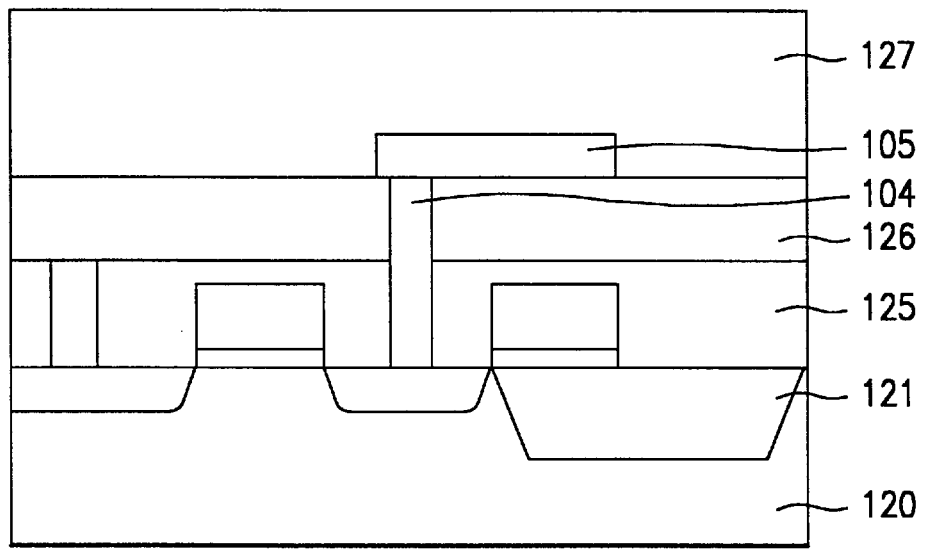

FIG. 12f is a sectional view taken along line I–I' of FIG. 11f. A metal such as tungsten is deposited on the entire surface including the third and fourth plug layers 104 and 104a. Then, a first pad layer 105 is formed to be connected with the third plug layer 104, and a second pad layer 105a (not shown) is formed to be connected with the fourth plug layer.

At this time, the first and second pad layers 105 and 105a are formed along the first and second bitlines 103 and 103a at a predetermined width.

Thereafter, the fourth insulating layer 107 is thickly deposited on the entire surface including the first pad layer 105 and then planarized by CMP process.

Figure 12G:
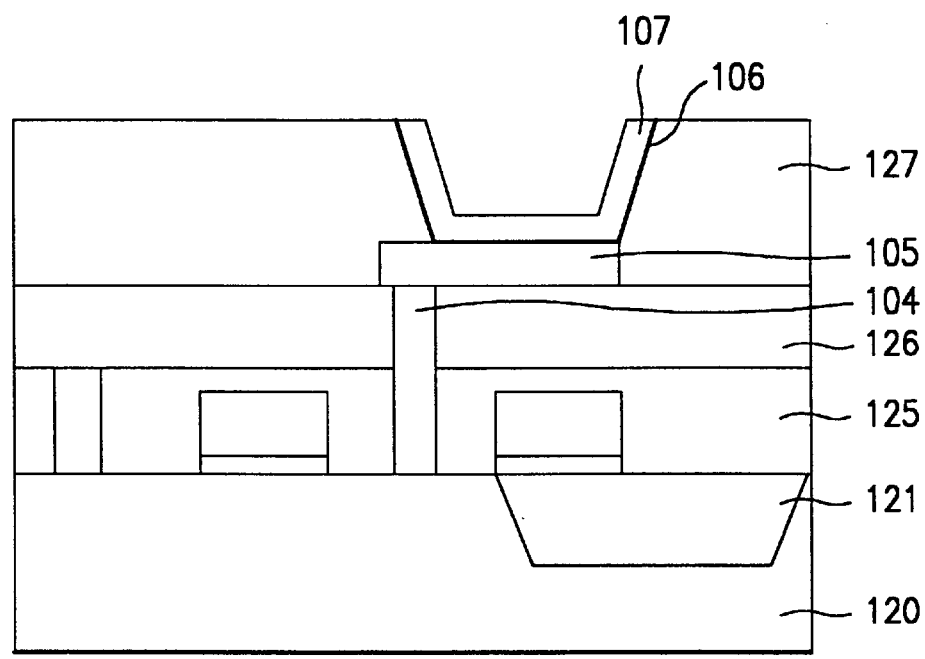

FIG. 12g is a sectional view taken along line I–I' of FIG. 11g. The fourth insulating layer 127 is selectively removed to expose the first pad layer 105 so that a trench is formed.

A first barrier metal layer 106 to be electrically connected with the first pad layer 105 and a second barrier metal layer 106a to be electrically connected with the second pad layer 105a are formed on the entire surface including the trench.

At this time, the second barrier metal layer 106a is formed to overlap the first bitline 103 and the second bitline.

A material for a lower electrode of the ferroelectric capacitor is deposited on the barrier metal layers 106 and 106a and then patterned to form a lower electrode 107 of the first ferroelectric capacitor and a lower electrode 107a(not shown) of the second ferroelectric capacitor.

In forming the lower electrodes 107 and 107a of the first and second ferroelectric capacitors, a trench is formed on the fourth insulating layer 127 and the lower electrode of the ferroelectric capacitor is formed along the lower side of the trench and both sides of the trench. Therefore, it is possible to easily form the lower electrode material of the ferroelectric capacitor.

Figure 12H:
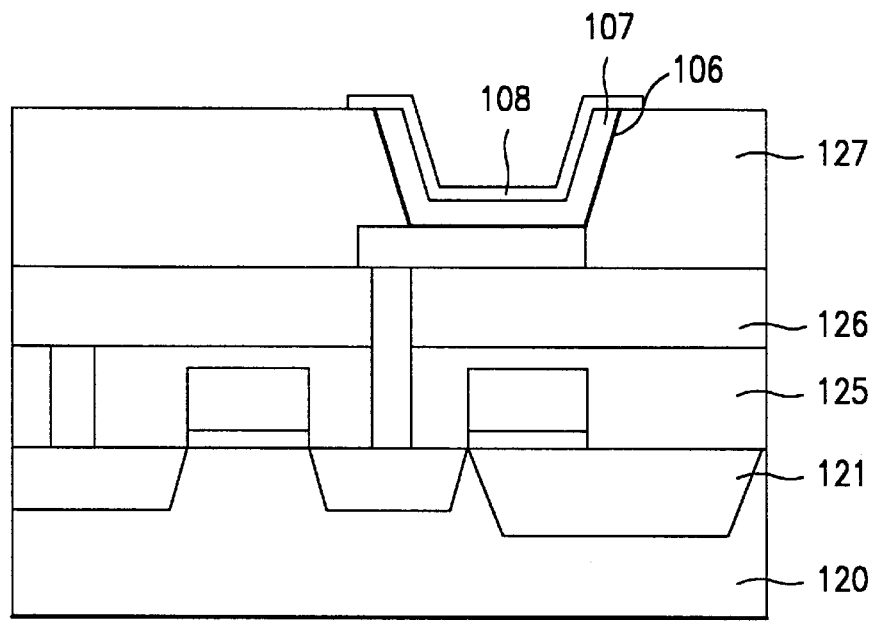

FIG. 12h is a sectional view taken along line I–I' of FIG. 11h. A photoresist or silicon oxide such as silicate on glass (SOG) is deposited on the entire surface including the lower electrodes 107 and 107a of the ferroelectric capacitor.

Afterwards, the entire surface is etched until the surface of the fourth insulating layer 127 is exposed. Then, the photoresist or SOG remains on the lower electrodes 107 and 107a of the first and second ferroelectric capacitors in the trench.

Subsequently, the photoresist or SOG is removed and a ferroelectric film is deposited on the entire surface and then patterned to form a first ferroelectric film 108 in a portion corresponding to the first split wordline 103 and a second ferroelectric film 108a in a portion corresponding to the second split wordline 103a.

Figure 12I:
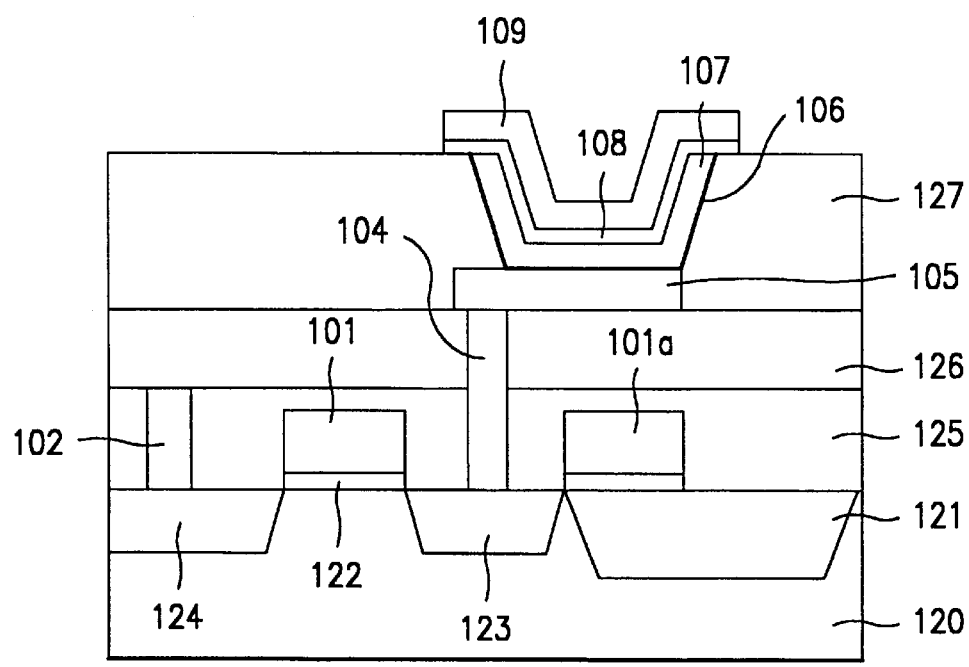

FIG. 12i is a sectional view taken along line I–I' of FIG. 11i. An upper electrode material of the ferroelectric capacitor is formed on the entire surface including the first and second ferroelectric films 108 and 108a and then patterned to form an upper electrode 109 of the first ferroelectric capacitor on the first ferroelectric film 108 over the lower electrode 107 of the first ferroelectric capacitor and an upper electrode 109a of the second ferroelectric capacitor on the second ferroelectric film 108a over the lower electrode 107a of the second ferroelectric capacitor.

The upper electrode 109 of the first ferroelectric capacitor is connected with the second split wordline 103a in a peripheral area not a cell area. Then, a metal layer (not shown) is formed to electrically connect the upper electrode 109a of the second ferroelectric capacitor with the first split wordline 103. As a result, the method for manufacturing the nonvolatile ferroelectric memory device is completed.

As aforementioned, the nonvolatile ferroelectric memory device and the method for manufacturing the same have the following advantages.

In the present invention, the trench is formed by etching the insulating layer without directly etching an electrode material of the ferroelectric capacitor and the ferroelectric capacitor is formed in the trench. Therefore, it is possible to thickly form the lower electrode material of the capacitor, thereby increasing a sectional area of the capacitor.

In addition, since the ferroelectric capacitor is formed on the split wordline, it is easy to design layout. Such efficient layout design can result in reduction of the cell size.

It will be apparent to those skilled in the art that various modifications and variations can be made in the nonvolatile ferroelectric memory device and the method for manufacturing the same according to the present invention without departing from the spirit or scope of the invention. Thus, it is intended that the present invention covers the modifications and variations of the invention provided they come within the scope of the appended claims and their equivalents.

What is claimed is:

1. A method for manufacturing a nonvolatile ferroelectric memory device comprising the steps of:

asymmetrically defining first and second active regions at a certain interval;

forming first and second split wordlines across the respective active regions;

forming first and second plug layers to be connected with one sides of the first and second active regions and to be respectively extended to regions where first and second bitlines will be formed;

forming first and second bitlines respectively connected with the first and second plug layers;

forming third and fourth plug layers respectively connected with other sides of the first and second active regions;

forming a lower electrode of a first ferroelectric capacitor on the second split wordline to be connected with the third plug layer and forming a lower electrode of a second ferroelectric capacitor on the first split wordline;

forming a first ferroelectric film on the lower electrode of the first ferroelectric capacitor and forming a second ferroelectric film on the lower electrode of the second ferroelectric capacitor; and forming an upper electrode of the first ferroelectric capacitor on the first ferroelectric film, and forming an upper electrode of the second ferroelectric capacitor on the second ferroelectric film.

2. The method for manufacturing a nonvolatile ferroelectric memory device as claimed in claim 1, further comprising the step of forming a first insulating layer between the first and second split wordlines and the substrate.

3. The method for manufacturing a nonvolatile ferroelectric memory device as claimed in claim 1, further comprising the step of forming a second insulating layer between the first and second split wordlines and the first and second bitlines.

4. The method for manufacturing a nonvolatile ferroelectric memory device as claimed in claim 1, further comprising the step of forming a third insulating layer on an entire surface of the substrate including the first and second bitlines after forming the first and second bitlines.

5. The method for manufacturing a nonvolatile ferroelectric memory device as claimed in claim 4, after forming the third insulating layer, further comprising the steps of:

etching the third insulating layer to expose source impurity regions of the first and second active regions so that a contact hole is formed;

forming third and fourth plug layers buried in the contact hole; and forming a first pad layer connected with the third plug layer and a second pad layer connected with the fourth plug layer.

6. The method for manufacturing a nonvolatile ferroelectric memory device as claimed in claim 5, after forming the fourth insulating layer on the entire surface including the first and second pad layers, further comprising the steps of:

forming a trench to expose the first and second pad layers;

forming first and second barrier metal layers at both sides of the exposed first and second pad layers and the trench; and forming a lower electrode of the first ferroelectric capacitor on the first barrier metal layer and a lower electrode of the second ferroelectric capacitor on the second barrier metal layer.

7. The method for manufacturing a nonvolatile ferroelectric memory device as claimed in claim 1, after forming upper electrodes of the first and second ferroelectric capacitors, further comprising the steps of: connecting the upper electrode of the first ferroelectric capacitor with the second split wordline and connecting the upper electrode of the second ferroelectric capacitor with the first split wordline.

8. The method for manufacturing a nonvolatile ferroelectric memory device as claimed in claim 1, wherein the first and second plug layers are formed of any one of tungsten or polysilicon.

9. A method for manufacturing a nonvolatile ferroelectric memory device comprising the steps of:

selectively forming a device isolation layer on a semiconductor substrate to define an active region;

forming first and second split wordlines on a first insulating layer formed on the active region and the device isolation layer;

forming first source/drain impurity regions of second conductivity types at both sides of the first split wordline and second source/drain impurity regions of second conductivity types at both sides of the second split wordline;

forming a second insulating layer on an entire surface including the first and second split wordlines;

forming first and second plug layers to be respectively connected with the first and second drain impurity regions by passing through the second insulating layer;

forming a first bitline connected with the first plug layer and a second bitline connected with the second plug layer to cross the first and second split wordlines;

forming a third insulating layer on the entire surface including the first and second bitlines;

forming third and fourth plug layers respectively connected with the first and second source impurity regions by passing through the third insulating layer;

forming first and second pad layers respectively connected with the third and fourth plug layers;

forming a fourth insulating layer on the entire surface including the first and second pad layers;

forming a trench on the fourth insulating layer to expose the first and second pad layers;

forming first and second barrier metal layers at both sides of the exposed first and second pad layers and the trench;

forming a lower electrode of a first ferroelectric capacitor on the first barrier metal layer over the second split wordline and a lower electrode of a second ferroelectric capacitor on the second barrier metal layer over the first split wordline;

respectively forming first and second ferroelectric films on the lower electrodes of the first and second ferroelectric capacitors; and forming an upper electrode of the first ferroelectric capacitor on the first ferroelectric film and an upper electrode of the second ferroelectric capacitor on the second ferroelectric film.

10. The method for manufacturing a nonvolatile ferroelectric memory device as claimed in claim 9, after forming the upper electrodes of the first and second ferroelectric capacitors, further comprising the steps of:

forming a fifth insulating layer on the entire surface including the upper electrodes of the first and second ferroelectric capacitors;

selectively etching the fifth insulating layer to expose the upper electrodes of the first and second ferroelectric capacitors so that a contact hole is formed; and electrically connecting the upper electrode of the first ferroelectric capacitor with the second split wordline and the upper electrode of the second ferroelectric capacitor with the first split wordline through the contact hole.

11. The method for manufacturing a nonvolatile ferroelectric memory device as claimed in claim 10, wherein the step of connecting the upper electrodes with the split wordlines is performed in a peripheral area.

12. The method for manufacturing a nonvolatile ferroelectric memory device as claimed in claim 9, wherein the first and second plug layers are respectively extended to regions where first and second bitlines will be formed.

13. The method for manufacturing a nonvolatile ferroelectric memory device as claimed in claim 12, wherein the first and second plug layers are formed of either polysilicon or metal.

14. The method for manufacturing a nonvolatile ferroelectric memory device as claimed in claim 13, wherein the metal includes tungsten.

* * * * *